(12) United States Patent
Lee et al.

(10) Patent No.: US 12,101,969 B2
(45) Date of Patent: Sep. 24, 2024

(54) DISPLAY DEVICE AND METHOD OF MANUFACTURING THE SAME

(71) Applicant: Samsung Display Co., Ltd., Yongin-si (KR)

(72) Inventors: Seho Lee, Yongin-si (KR); Taehyung Kim, Yongin-si (KR); Jihwan Yoon, Yongin-si (KR); Hojun Lee, Yongin-si (KR); Sangwoo Pyo, Yongin-si (KR); Jaehoon Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 416 days.

(21) Appl. No.: 17/649,910

(22) Filed: Feb. 3, 2022

(65) Prior Publication Data

US 2022/0406860 A1 Dec. 22, 2022

(30) Foreign Application Priority Data

Jun. 16, 2021 (KR) .................. 10-2021-0078068

(51) Int. Cl.
*H01L 27/32* (2006.01)
*H10K 50/824* (2023.01)
(Continued)

(52) U.S. Cl.
CPC ......... *H10K 59/122* (2023.02); *H10K 50/824* (2023.02); *H10K 59/124* (2023.02); *H10K 59/131* (2023.02); *H10K 71/00* (2023.02)

(58) Field of Classification Search
CPC ... H10K 59/122; H10K 50/824; H10K 59/124
See application file for complete search history.

(56) References Cited

U.S. PATENT DOCUMENTS 10,128,322 B2 11/2018 Hong et al.
10,147,769 B2 12/2018 Lee et al.
(Continued)

FOREIGN PATENT DOCUMENTS

JP 2016-62885 A 4/2016
KR 10-2017-0015633 A 2/2017
(Continued)

OTHER PUBLICATIONS

International Search Report dated Jul. 11, 2022, for PCT Patent Application No. PCT/KR2022/005214, 3 pages.

*Primary Examiner* — Thao P Le
(74) *Attorney, Agent, or Firm* — Lewis Roca Rothgerber Christie LLP

(57) ABSTRACT

A display device includes: a substrate; an organic insulating layer on the substrate and having an opening; a first electrode on the organic insulating layer; an auxiliary electrode on the organic insulating layer and including a first portion overlapping the opening; a bank layer having a first bank opening overlapping the first electrode and a second bank opening overlapping the first portion; an intermediate layer on the first electrode and the auxiliary electrode, the intermediate layer including a hole exposing a portion of the auxiliary electrode; and a second electrode on the intermediate layer, overlapping the first electrode and the auxiliary electrode, and in contact with the auxiliary electrode through the hole in the intermediate layer. The hole in the intermediate layer only partially overlaps the opening in the organic insulating layer and is located within the second bank opening in a plan view.

20 Claims, 14 Drawing Sheets

(51) Int. Cl.
*H10K 59/122* (2023.01)
*H10K 59/124* (2023.01)
*H10K 59/131* (2023.01)
*H10K 71/00* (2023.01)

(56) References Cited

U.S. PATENT DOCUMENTS

| | | | |
|---|---|---|---|
| 10,186,569 B2 | 1/2019 | Matsumi | |
| 10,186,680 B2 | 1/2019 | Lee | |
| 2019/0115561 A1* | 4/2019 | Tang | H10K 59/1213 |
| 2020/0303469 A1* | 9/2020 | Lee | H10K 71/00 |
| 2021/0255723 A1* | 8/2021 | Kim | G06F 3/0443 |
| 2022/0085132 A1* | 3/2022 | Kim | H10K 59/123 |
| 2022/0131111 A1* | 4/2022 | Lee | G06F 3/0446 |
| 2022/0149321 A1* | 5/2022 | Jeon | H10K 71/00 |
| 2023/0232701 A1* | 7/2023 | Kim | H10K 77/10 257/40 |

FOREIGN PATENT DOCUMENTS

| | | |
|---|---|---|
| KR | 10-2017-0063326 A | 6/2017 |
| KR | 10-2018-0004488 A | 1/2018 |
| KR | 10-2018-0066320 A | 6/2018 |
| KR | 10-2018-0104225 A | 9/2018 |
| KR | 10-2020-0113056 A | 10/2020 |

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2021-0078068, filed on Jun. 16, 2021, in the Korean Intellectual Property Office (KIPO), the entire disclosure of which is incorporated by reference herein.

BACKGROUND

1. Field

One or more embodiments relate to a display device and a method of manufacturing the display device.

2. Description of the Related Art

The rapid advancement of display fields that visually express various electrical-signal information has led to the introduction of various display devices having excellent characteristics, such as small thickness, light weight, and low power consumption.

A display device may include liquid display devices that use light of a backlight instead of autonomously emitting light, or light-emitting display devices including a display element that is capable of emitting light. The light-emitting display device may include display elements that include an emission layer.

SUMMARY

Aspects of one or more embodiments of the present disclosure relate to a display device and a method of manufacturing the display device, and more particularly, to a structure and a method that pertain to a light-emitting display device.

Additional aspects will be set forth in part in the description which follows and, in part, will be apparent from the description, or may be learned by practice of the presented embodiments of the present disclosure.

According to one or more embodiments, a display device includes a substrate, an organic insulating layer on the substrate and having an opening, a first electrode on the organic insulating layer, an auxiliary electrode on the organic insulating layer and including a first portion overlapping the opening in the organic insulating layer, a bank layer having a first bank opening overlapping the first electrode and a second bank opening overlapping the first portion, an intermediate layer on the first electrode and the auxiliary electrode, the intermediate layer having a hole exposing a portion of the auxiliary electrode, and a second electrode on the intermediate layer, overlapping the first electrode and the auxiliary electrode, and in contact with the auxiliary electrode through the hole in the intermediate layer. The hole in the intermediate layer only partially overlaps the opening in the organic insulating layer and is located within the second bank opening in a plan view.

In a plan view, a portion of the hole in the intermediate layer may be located in the opening in the organic insulating layer, and a remaining portion of the hole in the intermediate layer may be located between a contour line of the opening in the organic insulating layer and a contour line of the second bank opening.

The organic insulating layer may include an inclined surface adjacent to the opening, and a portion of a contact area between the second electrode and the auxiliary electrode may be located on the inclined surface of the organic insulating layer.

A center of the hole in the intermediate layer may be located within the opening in the organic insulating layer in a plan view.

The center of the hole in the intermediate layer may be spaced (or spaced apart) by about 1 μm or greater from an inner edge of the organic insulating layer that defines the opening in the organic insulating layer.

The display device may further include a common voltage line on the substrate and extending in a direction, and an auxiliary common voltage line overlapping the common voltage line and electrically connected to the common voltage line through a contact hole defined in at least one insulating layer arranged between the auxiliary common voltage line and the common voltage line. The auxiliary common voltage line and the common voltage line may overlap the opening in the organic insulating layer.

The display device may further include an inorganic insulating layer in direct contact with an upper surface of the auxiliary common voltage line.

The first portion of the auxiliary electrode overlapping the opening in the organic insulating layer may have a width greater than a width of the opening in the organic insulating layer. The auxiliary electrode may include a second portion that is integrally provided as a single body with the first portion and has a width less than a width of the first portion. The second portion of the auxiliary electrode may be electrically connected to the auxiliary common voltage line through a contact hole that penetrates through the organic insulating layer and the inorganic insulating layer.

The intermediate layer may include an emission layer. The hole in the intermediate layer may include a hole penetrating through the emission layer.

According to one or more embodiments, a method of manufacturing a display device includes providing, on a substrate, an organic insulating layer having an opening, providing a first electrode on the organic insulating layer, providing, on the organic insulating layer, an auxiliary electrode comprising a first portion overlapping the opening of the organic insulating layer, providing a bank layer having a first bank opening overlapping the first electrode and a second bank opening overlapping the first portion of the auxiliary electrode, providing an intermediate layer on the first electrode and the auxiliary electrode, providing, in the intermediate layer, a hole that exposes a portion of the auxiliary electrode, and providing a second electrode on the intermediate layer so that the second electrode is in contact with the auxiliary electrode through the hole in the intermediate layer. The hole in the intermediate layer only partially overlaps the opening in the organic insulating layer and is located within the second bank opening in a plan view.

The providing the hole may include irradiating a laser beam on the intermediate layer. A portion of the laser beam may be located between a contour line of the opening in the organic insulating layer and a contour line of the second bank opening in a plan view.

A center of the laser beam may be located within the second bank opening.

A center of the hole in the intermediate layer may be spaced (or spaced apart) by about 1 μm or greater from an inner edge of the organic insulating layer that defines the opening in the organic insulating layer.

The organic insulating layer may include an inclined surface adjacent to the opening. In the providing the second electrode, a portion of a contact area between the second electrode and the auxiliary electrode may be located on the inclined surface of the organic insulating layer.

The first portion of the auxiliary electrode overlapping the opening in the organic insulating layer may have a width greater than a width of the opening in the organic insulating layer. The auxiliary electrode may include a second portion that is integrally provided as a single body with the first portion and has a width less than a width of the first portion.

The method may further include providing a common voltage line that is arranged on the substrate and extends in a direction, and providing an auxiliary common voltage line that overlaps the common voltage line and is electrically connected to the common voltage line through a contact hole defined in at least one insulating layer arranged between the auxiliary common voltage line and the common voltage line. The auxiliary common voltage line and the common voltage line may overlap the opening in the organic insulating layer.

The method may further include providing an inorganic insulating layer on the auxiliary common voltage line.

The method may further include providing a contact hole that penetrates through the organic insulating layer and the inorganic insulating layer to electrically connect the second portion of the auxiliary electrode to the auxiliary common voltage line.

In a plan view, a portion of a contour line of the opening in the organic insulating layer may overlap the hole in the intermediate layer.

The providing the intermediate layer may include providing an emission layer that overlaps the first electrode and the auxiliary electrode. The providing the hole may include providing a hole that penetrates through the emission layer.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
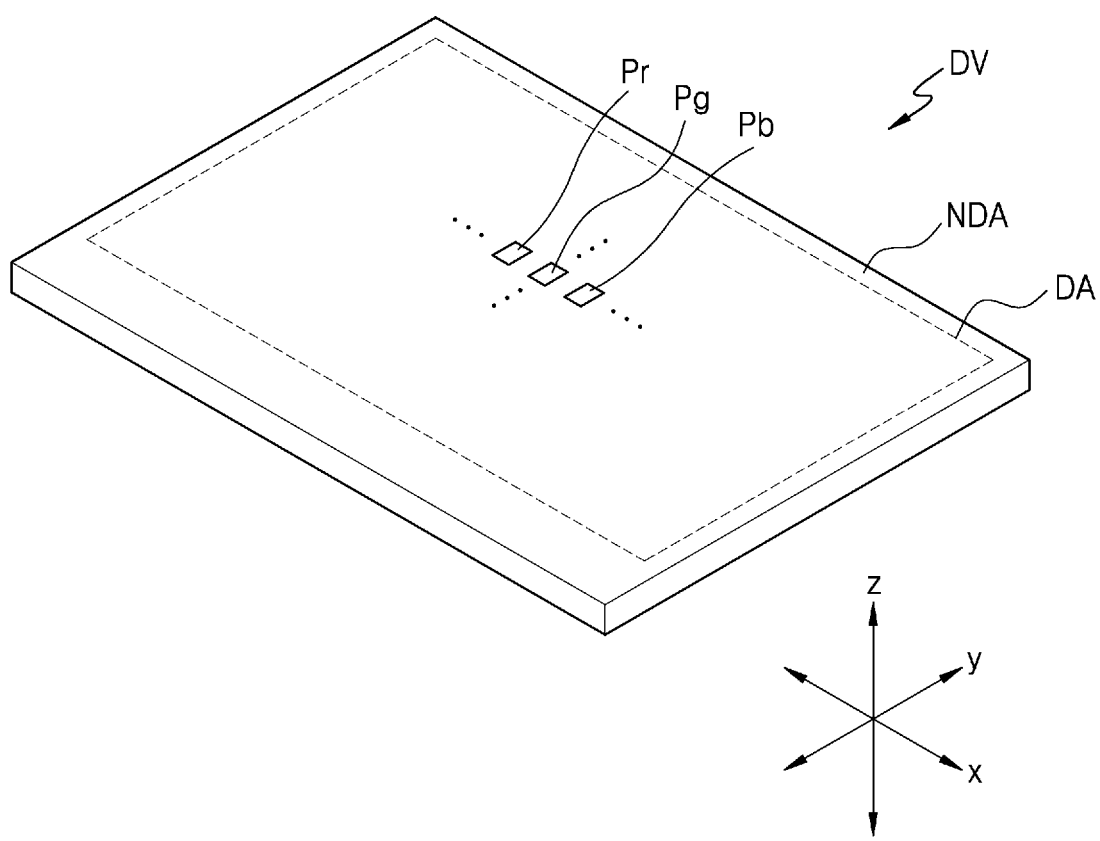
FIG. 1 is a perspective view schematically illustrating a display device according to one or more embodiments.

Reference will now be made in more detail to embodiments of the present disclosure, examples of which are illustrated in the accompanying drawings, wherein like reference numerals refer to like elements throughout the present disclosure. In this regard, the present embodiments may have different forms and configurations and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

In one or more embodiments below, terms such as "first" and "second" are used herein merely to describe a variety of elements, but the elements are not limited by the terms. Such terms are used only for the purpose of distinguishing one element from another element.

An expression used in the singular encompasses an expression of the plural unless the context expressly indicates otherwise.

It will be understood that the terms "includes," "including," "comprises," and/or "comprising" used herein specify the presence of stated features or elements, but do not preclude the presence or addition of one or more other features or elements.

It will be further understood that when a layer, area, or element is referred to as being "formed on" another layer, area, or element, it can be directly or indirectly formed on the other layer, region, or element. That is, for example, one or more intervening layers, areas, or elements may be present therebetween.

Further, the use of "may" when describing embodiments of the present disclosure refers to "one or more embodiments of the present disclosure".

In the drawings, sizes of components in the drawings may be exaggerated or reduced for convenience of explanation. In other words, because sizes and thicknesses of components in the drawings are arbitrarily illustrated for convenience of explanation, the following embodiments are not limited thereto.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

When one or more embodiments may be implemented differently, a certain process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, regions, areas, or elements or the like are referred to as being "electrically connected," they may be directly electrically connected, or layers, areas or elements may be indirectly electrically connected, and an intervening layer, region, component, or the like may be present therebetween.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display device DV according to one or more embodiments.

Referring to FIG. 1, the display device DV may include a display area DA and a non-display area NDA outside of the display area DA. The display device DV may provide an image in the display area DA through an array of a plurality of pixels arranged in a two-dimensional manner on an x-y plane. The plurality of pixels includes a first pixel, a second pixel, and a third pixel, and hereinafter, for convenience of description, it is described that the first pixel is a red pixel Pr, the second pixel is a green pixel Pg, and the third pixel is a blue pixel Pb.

The red pixel Pr, the green pixel Pg, and the blue pixel Pb are areas that are capable of emitting red light, green light, and blue light, respectively, and the display device DV may provide an image by using light emitted by the pixels.

The non-display area NDA is an area in which an image is not provided, and may be around (e.g., entirely surround) the display area DA. A driver or a main voltage line may be arranged in the non-display area NDA to provide electrical signals or power to pixel circuits. A pad, to which an electronic element or a printed circuit board may be connected (e.g., electrically connected), may be included in the non-display area NDA.

The display area DA may have a polygonal shape, including a quadrilateral shape, as shown in FIG. 1. For example, the display area DA may be a rectangle of which the width is longer than the length, a rectangle of which the width is less than the length, or a square. In one or more embodiments, the display area DA may have various suitable shapes such as an oval shape or a circular shape.

Figure 2:
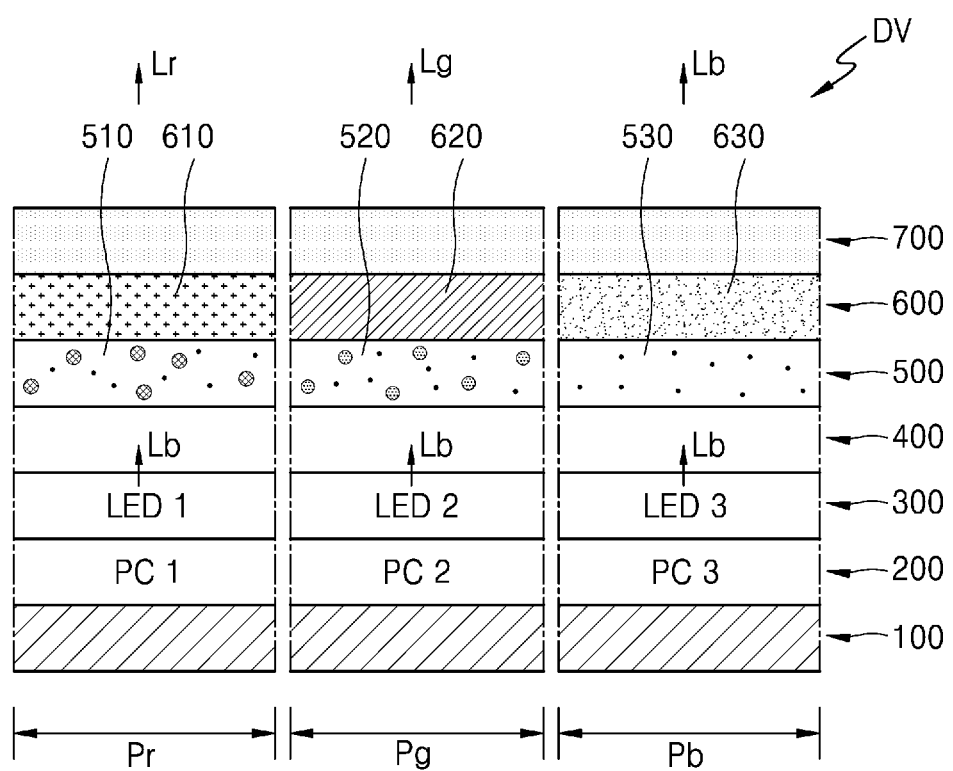
FIG. 2 is a cross-sectional view schematically illustrating pixels of a display device according to one or more embodiments.

FIG. 2 is a cross-sectional view schematically illustrating pixels of a display device DV according to one or more embodiments.

Referring to FIG. 2, the display device DV may include a circuit layer 200 on a substrate 100. The circuit layer 200 includes first to third pixel circuits PC1, PC2, and PC3, which may be connected (e.g., electrically connected) to first to third light-emitting diodes LED1, LED2, and LED3 of a light-emitting diode layer 300, respectively.

The first to third light-emitting diodes LED1, LED2, and LED3 may each include an organic light-emitting diode including an organic material. In another embodiment, the first to third light-emitting diodes LED1, LED2, and LED3 may each include an inorganic light-emitting diode including an inorganic material. The inorganic light-emitting diode may include a p-n junction diode including materials based on an inorganic semiconductor. When a voltage is applied to the p-n junction diode in a forward direction, holes and electrons are injected, and energy generated by recombination of the holes and the electrons is converted into light energy to emit light of a color. The inorganic light-emitting diode described above may have a width of several micrometers to several hundred micrometers or several nanometers to several hundred nanometers. In one or more embodiments, a light-emitting diode (e.g., first, second, and third light-emitting diodes LED, LED1, LED2, and LED3) may include a light-emitting diode including quantum dots. As described above, an emission layer of the light-emitting diode (e.g., first, second, and third light-emitting diodes LED, LED1, LED2, and LED3) may include an organic material, an inorganic material, quantum dots, an organic material and quantum dots, or an inorganic material and quantum dots.

The first to third light-emitting diodes LED1, LED2, and LED3 may emit light of a same color. For example, light (e.g., blue light Lb) emitted by the first to third light-emitting diodes LED1, LED2, and LED3 may pass through a color-conversion transmissive layer 500 via an encapsulation layer 400 on the light-emitting diode layer 300.

The color-conversion transmissive layer 500 may include optical portions that transmit light (e.g., blue light Lb) emitted from the light-emitting diode layer 300, with or without color conversion. For example, the color-conversion transmissive layer 500 may include color-conversion portions that converts light (e.g., blue light Lb) emitted from the light-emitting diode layer 300 into light of a different color, and a transmissive portion that transmits light (e.g., blue light Lb) emitted from the light-emitting diode layer 300 without color conversion. The color-conversion transmissive layer 500 may include a first color-conversion portion 510 corresponding to the red pixel Pr, a second color-conversion portion 520 corresponding to the green pixel Pg, and a transmissive portion 530 corresponding to the blue pixel Pb. The first color-conversion portion 510 may convert blue light Lb into red light Lr, and the second color-conversion portion 520 may convert blue light Lb into green light Lg. The transmissive portion 530 may transmit blue light Lb without converting a color thereof.

A color layer 600 may be arranged on the color-conversion transmissive layer 500. The color layer 600 may include first to third color filters 610, 620, and 630 that emit light of different colors from each other. For example, the first color filter 610 may include a red color filter, the second color filter 620 may include a green color filter, and the third color filter 630 may include a blue color filter.

Light, which are color-converted or transmitted by the color-conversion transmissive layer 500, may have improved color purity as they pass through the first to third color filters 610, 620, and 630. In addition, the color layer 600 may prevent, reduce, or minimize reflection and user visibility of external light (e.g., light incident toward the display device DV from outside of the display device DV).

The display device DV may include a light-transmitting base layer 700 on the color layer 600. The light-transmitting base layer 700 may include glass or a light-transmitting organic material. For example, the light-transmitting base layer 700 may include a light-transmitting organic material such as an acryl-based resin.

In one or more embodiments, the light-transmitting base layer 700 is a kind of substrate, and after the color layer 600 and the color-conversion transmissive layer 500 are provided on the light-transmitting base layer 700, the light-transmitting base layer 700, the color layer 600, and the color-conversion transmissive layer 500 may be provided so that the color-conversion transmissive layer 500 faces the encapsulation layer 400.

In another embodiment, after the color-conversion transmissive layer 500 and the color layer 600 are sequentially provided above the encapsulation layer 400, the light-transmitting base layer 700 may be coated (e.g., directly coated) and cured on the color layer 600. In one or more embodiments, another optical film, for example, an anti-reflection (AR) film or the like, may be arranged on the light-transmitting base layer 700.

The display device DV having the structure described above may include televisions, billboards, cinema screens, monitors, tablet personal computers (PCs), laptop computers, etc.

Figure 3:
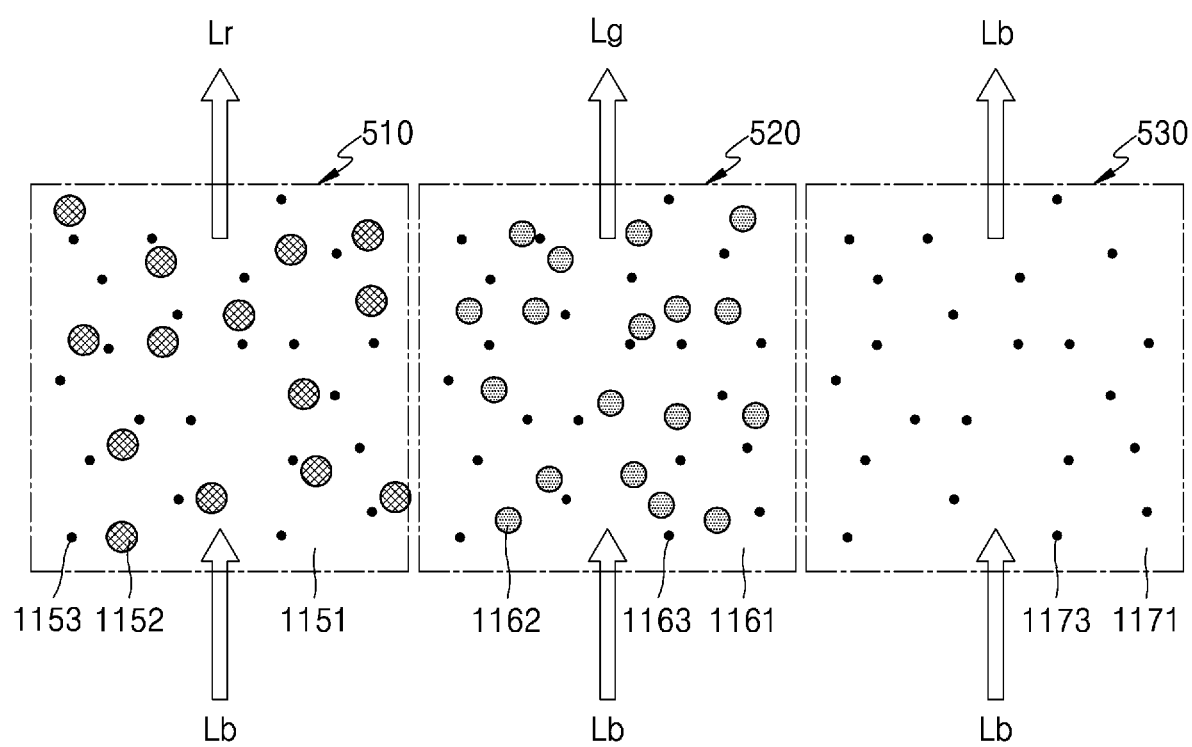
FIG. 3 shows optical portions of a color-conversion transmissive layer of FIG. 2.

FIG. 3 shows optical portions of the color-conversion transmissive layer in FIG. 2.

Referring to FIG. 3, the first color-conversion portion 510 may convert blue light Lb that is incident thereon, into red light Lr. The first color-conversion portion 510 may include, as shown in FIG. 3, a first photosensitive polymer 1151, and first quantum dots 1152 and first scattering particles 1153 that are dispersed in the first photosensitive polymer 1151.

The first quantum dots 1152 may be excited by blue light Lb and may isotropically emit red light Lr, of which a wavelength is greater than a wavelength of blue light Lb. The first photosensitive polymer 1151 may include a light-transmitting organic material. The first scattering particles 1153 may scatter blue light Lb that is not absorbed by the first quantum dots 1152 so that more first quantum dots 1152 are excited, and thus, color-conversion efficiency may increase. The first scattering particles 1153 may include, for example, titanium oxide ($TiO_2$), metal particles, or the like. The first quantum dots 1152 may be selected from among group II-VI compounds, group III-V compounds, group IV-VI compounds, group IV elements, group IV compounds, and any suitable combinations thereof.

The second color-conversion portion 520 may convert blue light Lb that is incident, into green light Lg. The second color-conversion portion 520 may include, as shown in FIG. 3, a second photosensitive polymer 1161, and second quantum dots 1162 and second scattering particles 1163 that are dispersed in the second photosensitive polymer 1161.

The second quantum dots 1162 may be excited by blue light Lb and may isotopically emit green light Lg, of which a wavelength is greater than a wavelength of blue light Lb. The second photosensitive polymer 1161 may include a light-transmitting organic material.

The second scattering particles 1163 may scatter the blue light Lb that is not absorbed by the second quantum dots 1162 to excite more second quantum dots 1162, thereby improving color conversion efficiency. The second scattering particles 1163 may be, for example, $TiO_2$, metal particles, or the like. The second quantum dots 1162 may be selected from among group II-VI compounds, group III-V compounds, group IV-VI compounds, group IV elements, group IV compounds, and any suitable combinations thereof.

In one or more embodiments, the first quantum dots 1152 may have a same material as the second quantum dots 1162. In this case, a size of the first quantum dots 1152 may be greater than a size of the second quantum dots 1162.

The transmissive portion 530 may transmit blue light Lb instead of converting the blue light Lb incident on the transmissive portion 530. As shown in FIG. 3, the transmissive portion 530 may include a third photosensitive polymer 1171 in which third scattering particles 1173 are dispersed. The third photosensitive polymer 1171 may include a light-transmitting organic material such as, for example, silicon resin, epoxy resin, or the like, and may have a same material as the first and second photosensitive polymers 1151 and 1161. The third scattering particles 1173 may scatter and emit the blue light Lb, and may have a same material as the first and second scattering particles 1153 and 1163.

Figure 4:
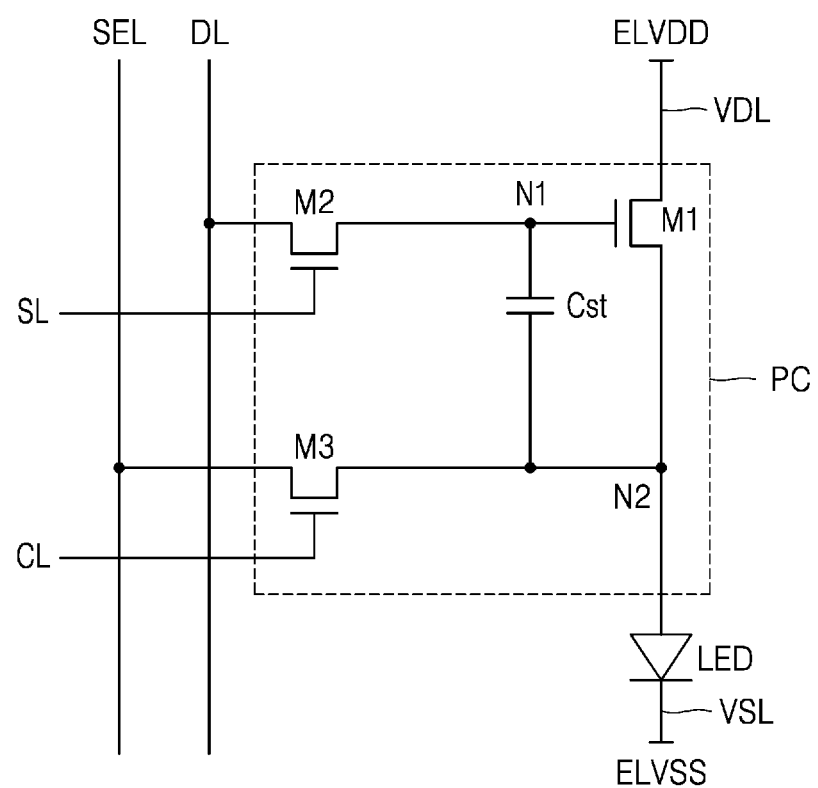
FIG. 4 is an equivalent circuit diagram illustrating a light-emitting diode included in a display device, and a pixel circuit electrically connected to the light-emitting diode, according to one or more embodiments.

FIG. 4 is an equivalent circuit diagram of a light-emitting diode LED included in a display device, and a pixel circuit PC connected (e.g., electrically connected) to the light-emitting diode LED, according to one or more embodiments.

Referring to FIG. 4, a first electrode (e.g., an anode) of a light-emitting diode, for example, the light-emitting diode LED, may be connected to the pixel circuit PC, and a second electrode (e.g., a cathode) of the light-emitting diode LED may be connected to a common voltage line VSL that provides a common power voltage ELVSS. The light-emitting diode LED may emit light at a luminance corresponding to an amount of current supplied from the pixel circuit PC.

The light-emitting diode LED in FIG. 4 may correspond to each of the first to third light-emitting diodes LED1, LED2, and LED3 described above with reference to FIG. 2, and the pixel circuit PC in FIG. 4 may correspond to each of the first to third pixel circuits PC1, PC2, and PC3 described above with reference to FIG. 2.

The pixel circuit PC may control an amount of current that flows from a driving power voltage ELVDD to the common power voltage ELVSS via the light-emitting diode LED, in response to a data signal. The pixel circuit PC may include a driving transistor M1, a switching transistor M2, a sensing transistor M3, and a storage capacitor Cst.

Each of the driving transistor M1, the switching transistor M2, and the sensing transistor M3 may include an oxide semiconductor thin-film transistor including a semiconductor layer including an oxide semiconductor, or may include a silicon semiconductor thin-film transistor including a semiconductor layer including polysilicon. A first electrode may be either one of a source electrode and a drain electrode, and a second electrode may be the other one of the source electrode and the drain electrode, according to a type of transistor.

A first electrode of the driving transistor M1 may be connected to a driving voltage line VDL for applying the driving power voltage ELVDD, and a second electrode of the driving transistor M1 may be connected to a first electrode of the light-emitting diode LED. A gate electrode of the driving transistor M1 may be connected to a first node N1. The driving transistor M1 may control an amount of current that flows from the driving power voltage ELVDD to the light-emitting diode LED, in response to a voltage of the first node N1.

The switching transistor M2 may include a switching transistor. A first electrode of the switching transistor M2 may be connected to a data line DL, and a second electrode may be connected to the first node N1. A gate electrode of the switching transistor M2 may be connected to a scan line SL. The switching transistor M2 may be turned on when a scan signal is transmitted to the scan line SL, to connect (e.g., electrically connect) the data line DL and the first node N1 to each other.

The sensing transistor M3 may include an initialization transistor and/or a sensing transistor. A first electrode of the sensing transistor M3 may be connected to a second node N2, and a second electrode may be connected to a sensing line SEL. A gate electrode of the sensing transistor M3 may be connected to a control line CL.

The storage capacitor Cst may be connected between the first node N1 and the second node N2. For example, a first capacitor electrode of the storage capacitor Cst may be connected to the gate electrode of the driving transistor M1, and a second capacitor of the storage capacitor Cst may be connected to the first electrode of the light-emitting diode LED.

In FIG. 4, the driving transistor M1, the switching transistor M2, and the sensing transistor M3 are n-channel metal-oxide-semiconductor field-effect transistors (NMOSs), but the present disclosure is not limited thereto. For example, at least one of the driving transistor M1, the switching transistor M2, or the sensing transistor M3 may be provided as p-channel metal-oxide-semiconductor field-effect transistors (PMOSs).

FIG. 4 shows only three transistors, but the present disclosure is not limited thereto. For example, the pixel circuit PC may include four or more transistors.

Figure 5:
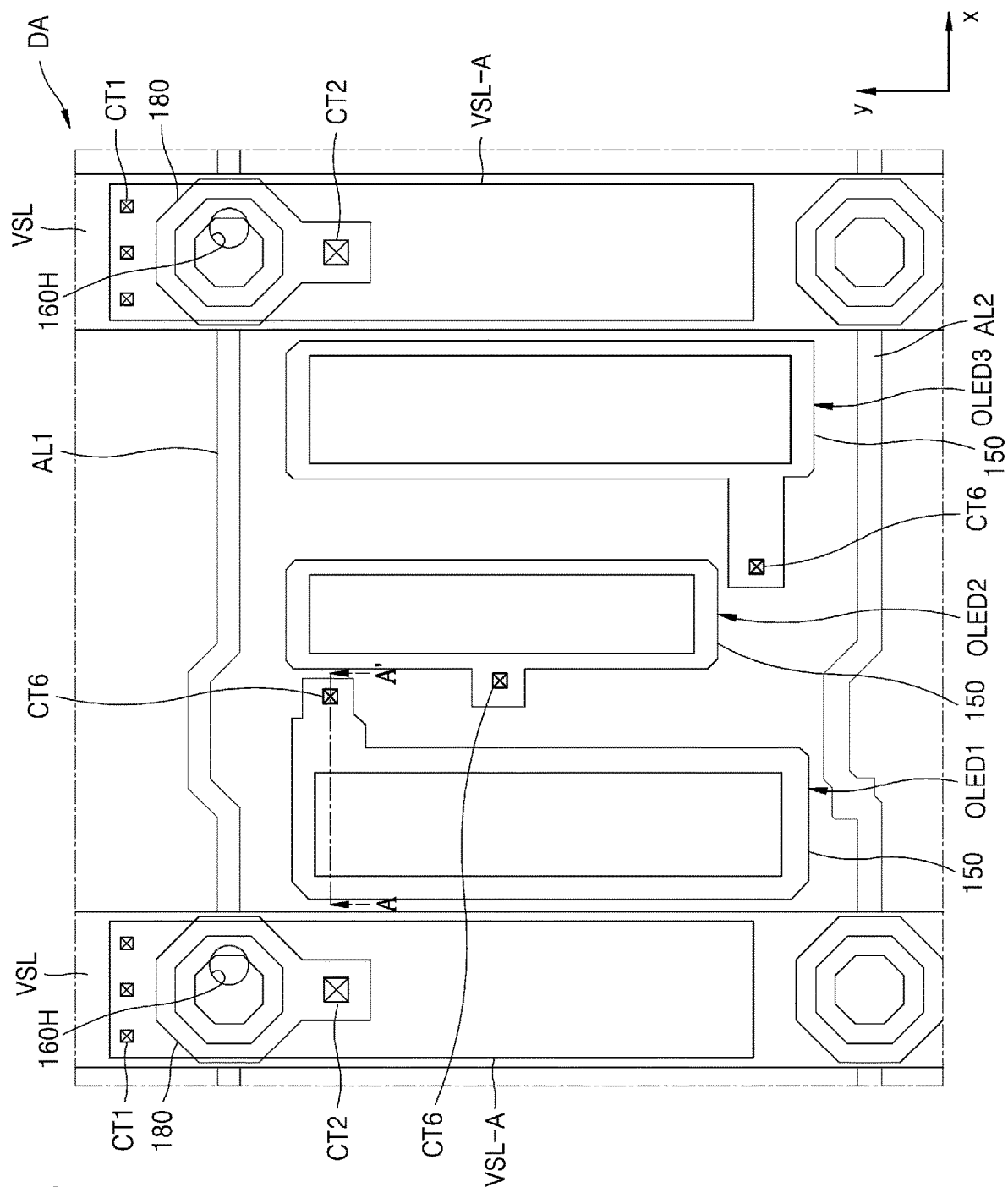
FIG. 5 is a plan view illustrating light-emitting diodes of a display device and lines arranged therearound, according to one or more embodiments.

FIG. 5 is a plan view of light-emitting diodes of a display device and lines arranged therearound, according to one or more embodiments.

Referring to FIG. 5, common voltage lines VSL are arranged in a display area DA, and may each extend in a y direction. The common voltage lines VSL are arranged apart from each other, and light-emitting diodes, for example, organic light-emitting diodes, may be arranged between two common voltage lines VSL adjacent to each other. In one or more embodiments, FIG. 5 shows that first to third organic light-emitting diodes OLED1, OLED2, and OLED3 are arranged between two common voltage lines VSL adjacent to each other.

Auxiliary lines each extending in a direction (e.g., an x direction) that crosses the common voltage lines VSL (e.g., the common voltage lines VSL extending in the y direction) may be arranged in the display area DA. In one or more embodiments, FIG. 5 shows that first and second auxiliary lines AL1 and AL2 each extend in the x direction, and the first and second auxiliary lines AL1 and AL2 may be arranged apart from or spaced from each other with the first to third organic light-emitting diodes OLED1, OLED2, and OLED3 therebetween. Each of the common voltage line VSL may be connected (e.g., electrically connected) to at least one of the first auxiliary line AL1 or the second auxiliary line AL2.

FIG. 5 shows a structure of a portion of the display area DA, and the display area DA may be understood to have the structure in FIG. 5 repeatedly arranged therein. For example, a plurality of common voltage lines VSL and a plurality of auxiliary lines are connected (e.g., electrically connected) to each other while crossing each other in the display area DA, and the common voltage lines VSL and the auxiliary lines may provide a mesh structure in a plan view. When the display area DA has a relatively large area, a voltage drop of a common voltage applied via the common voltage line VSL may be caused. However, this voltage drop may be prevented, reduced, or minimized by allowing the common voltage lines VSL and the auxiliary lines (e.g., the first auxiliary line AL1 or the second auxiliary line AL2) to have a mesh structure in a plan view.

An auxiliary electrode 180 may be arranged to overlap a portion of the common voltage line VSL. The auxiliary electrode 180 may be connected (e.g., electrically connected) to the common voltage line VSL through a first contact hole CT1 and a second contact hole CT2, and may receive power via the common voltage line VSL. Second electrode (e.g., a cathode) of the light-emitting diode, for example, the first to third organic light-emitting diodes OLED1, OLED2, and OLED3, may be connected (e.g., electrically connected) to the common voltage line VSL through the auxiliary electrode 180.

The common voltage line VSL may be connected (e.g., electrically connected) to an auxiliary common voltage line VSL-A arranged to overlap the common voltage line VSL. For example, the auxiliary common voltage line VSL-A may be connected to the common voltage line VSL through the second contact hole CT2.

A first electrode 150 (e.g., an anode) of each of light-emitting diodes, for example, the first to third organic light-emitting diodes OLED1, OLED2, and OLED3, may be connected (e.g., electrically connected) to a pixel circuit therebelow, through a sixth contact hole CT6. The pixel circuit connected to each of the first to third organic light-emitting diodes OLED1, OLED2, and OLED3 may include a plurality of transistors and a storage capacitor, as described above with reference to FIG. 4.

Figure 6:
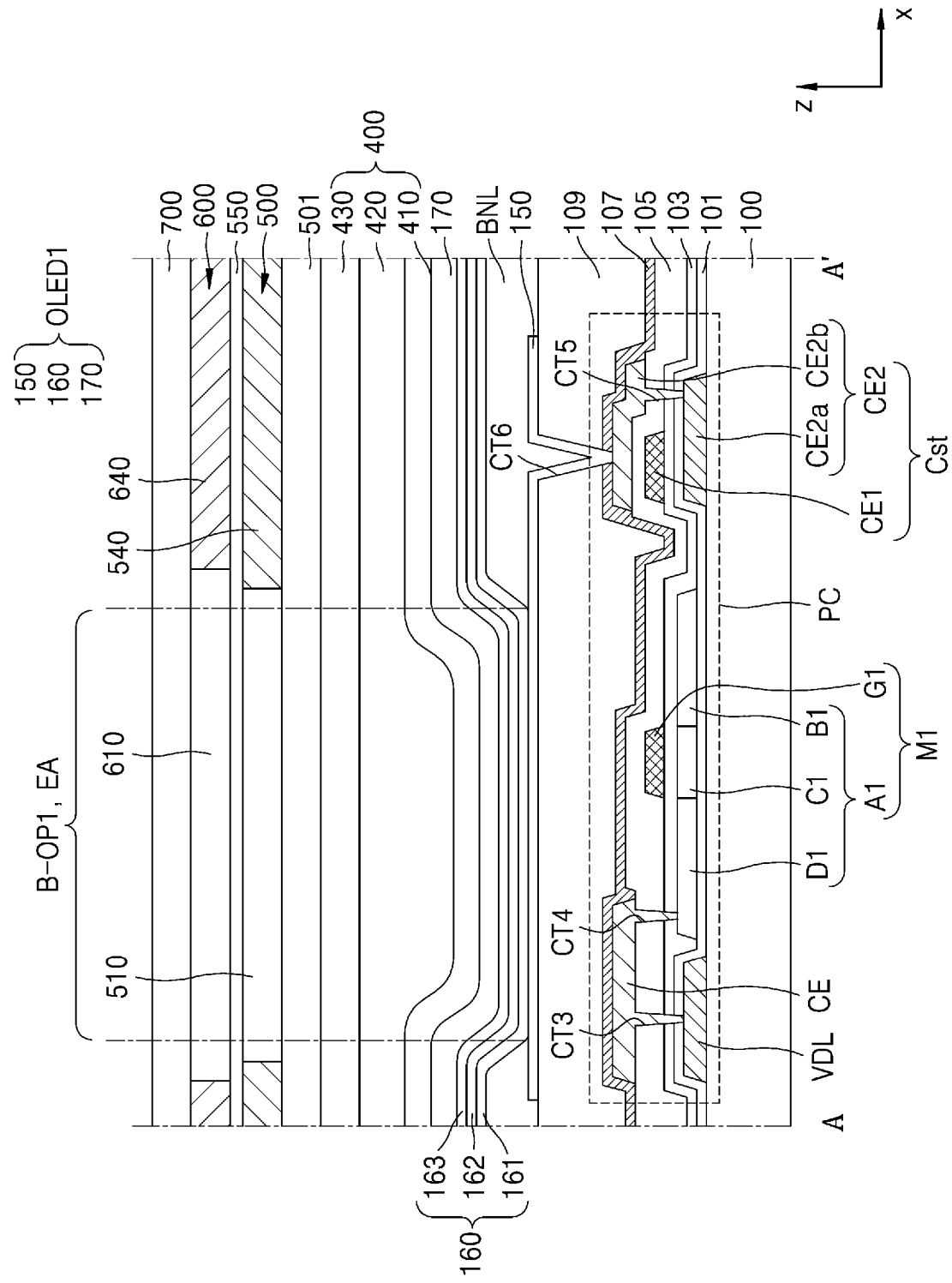
FIG. 6 is a cross-sectional view of the display device in FIG. 5 taken along the line A-A' in FIG. 5.

FIG. 6 is a cross-sectional view of the display device in FIG. 5 taken along the line A-A' in FIG. 5.

Referring to FIG. 6, a light-emitting diode, for example, the first organic light-emitting diode OLED1, is arranged on the substrate 100, and the pixel circuit PC may be arranged between the substrate 100 and the first organic light-emitting diode OLED1. Regarding the above, FIG. 6 shows that a driving transistor M1 and a storage capacitor Cst are included in the pixel circuit PC. In one or more embodiments, the second organic light-emitting diode OLED2 and a pixel circuit connected thereto and the third organic light-emitting diode OLED3 and a pixel circuit connected thereto may each include a same structure as the pixel circuit PC shown in FIG. 6.

The substrate 100 may include a material such as a glass material, a metal material, an organic material, or the like. For example, the substrate 100 may include a glass material having silicon dioxide ($SiO_2$) as a main component, or may include various materials that are flexible or bendable, for example, a polymer resin.

The driving transistor M1 may include a semiconductor layer A1 and a gate electrode G1. The semiconductor layer A1 may include an oxide-based material or a silicon-based material (e.g., amorphous silicon or polysilicon). For example, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The semiconductor layer A1 may include a channel area C1 and first and second low-resistance areas B1 and D1 arranged at opposite sides of the channel area C1. The first and second low-resistance areas B1 and D1 are areas having lower resistance than the channel area C1, and either one of the first and second low-resistance areas B1 and D1 may correspond to a source area, and the other one may correspond to a drain area.

The semiconductor layer A1 may be located on a first insulating layer 101 above the substrate 100. The first insulating layer 101 may prevent or substantially prevent impurities from penetrating into the semiconductor layer A1. The first insulating layer 101 may include an inorganic insulating material such as silicon nitride, silicon oxide, and/or silicon oxynitride.

A second insulating layer 103 may be between the semiconductor layer A1 and the gate electrode G1. The second insulating layer 103 may be a kind of gate insulating layer, and may include an inorganic insulating material such as silicon nitride, silicon oxide, and/or silicon oxynitride.

The gate electrode G1 may overlap the channel area C1 of the semiconductor layer A1. The gate electrode G1 may include molybdenum (Mo), copper (Cu), Ti, or the like, and may include a single-layer or multi-layer structure including the materials described above.

Either one of the first and second low-resistance areas B1 and D1 of the semiconductor layer A1 may be connected (e.g., electrically connected) to the driving voltage line VDL. The driving voltage line VDL may be arranged below the first insulating layer 101. FIG. 4 shows that the driving voltage line VDL is connected to the second low-resistance area D1 through a connection electrode CE above a third insulating layer 105.

The driving voltage line VDL may include a metal material such as Mo, Cu, Ti, or the like. For example, the driving voltage line VDL may include a stacked structure of a Ti layer (lower layer) and a Cu layer (upper layer) of which a thickness is greater than that of the Ti layer. In another embodiment, the driving voltage line VDL may have a multi-layer structure of one or more metal layers including the metal materials described above, and a transparent conducting oxide layer such as an ITO layer, above the metal layer(s). The third insulating layer 105 may include an inorganic insulating material such as silicon nitride, silicon oxide, and/or silicon oxynitride.

When the second low-resistance area D1 is a source area, the connection electrode CE is a source electrode of the driving transistor M1, and when the second low-resistance area D1 is a drain area, the connection electrode CE may be a drain electrode of the driving transistor M1. The connection electrode CE may be connected to the driving voltage line VDL through a third contact hole CT3 that penetrates through the first to third insulating layers 101, 103, and 105, and may be connected to a portion (e.g., the second low-resistance area D1) of the semiconductor layer A1 of the driving voltage line VDL through a fourth contact hole CT4 that penetrates through the second and third insulating layers 103 and 105. In one or more embodiments, the fourth contact hole CT4 may not penetrate through the first insulating layer 101. The connection electrode CE may include a metal material such as Mo, Cu, Ti, or the like. For example, the connection electrode CE may have a multi-layer structure that includes a Ti layer and a Cu layer. In another embodiment, the connection electrode CE may include one or more metal layers including the metal materials described above, and a transparent conducting oxide layer such as an ITO layer, above the one or more metal layers.

The storage capacitor Cst includes a first capacitor electrode CE1, and a second capacitor electrode CE2 that overlaps the first capacitor electrode CE1 with at least one insulating layer therebetween. The first capacitor electrode CE1 is provided on a same layer as the gate electrode G1, and may include a same material as the gate electrode G1. The first capacitor electrode CE1 may include Mo, Cu, Ti, or the like, and may include a single-layer or multi-layer structure including the materials described above.

In one or more embodiments, the second capacitor electrode CE2 may include two sub-capacitor electrodes CE2a and CE2b arranged below and above with the first capacitor electrode CE1 therebetween. One sub-capacitor electrode (hereinafter, referred to as a first sub-capacitor electrode CE2a) of the sub-capacitor electrodes CE2a and CE2b may be arranged between the substrate 100 and the first insulating layer 101, and the other sub-capacitor electrode (hereinafter, referred to as a second sub-capacitor electrode CE2b) may be arranged on the third insulating layer 105.

Each of the first sub-capacitor electrode CE2a and the second sub-capacitor electrode CE2b includes Mo, Cu, Ti, etc., and may include a single-layer or multi-layer structure including the materials described above. In one or more embodiments, the first sub-capacitor electrode CE2a is arranged on a same layer as the driving voltage line VDL, and may include a same material as the driving voltage line VDL.

The second sub-capacitor electrode CE2b may be connected to the first sub-capacitor electrode CE2a through a fifth contact hole CT5 that penetrates through the first to third insulating layers 101, 103, and 105. A capacitance may be provided between the first sub-capacitor electrode CE2a and the first capacitor electrode CE1 that overlap each other with the first and second insulating layers 101 and 103 therebetween, and a capacitance may be provided between the first capacitor electrode CE1 and the second sub-capacitor electrode CE2b that overlap each other with the third insulating layer 105 therebetween. By including a plurality of sub-capacitor electrodes in the second sub-capacitor as described above, a capacitance of the storage capacitor Cst may be improved.

A fourth insulating layer 107 is arranged on the pixel circuit PC that includes the driving transistor M1 and the storage capacitor Cst. The fourth insulating layer 107 may include an inorganic insulating material such as silicon nitride, silicon oxide, and/or silicon oxynitride. The fourth insulating layer 107 may prevent or protect a line including a metal (e.g., Cu or the like), that may be damaged by an etchant in a manufacturing process of a display device, from being exposed to an etching environment.

A fifth insulating layer 109 is arranged on the fourth insulating layer 107, and may include an organic insulating material. The fifth insulating layer 109 may include an organic insulating material such as acryl, benzocyclobutene (BCB), polyimide, hexamethyldisiloxane (HMDSO), or the like.

The first electrode 150 of a light-emitting diode is provided on the fifth insulating layer 109, and FIG. 6 shows the first electrode 150 of the first organic light-emitting diode OLED1.

The first electrode 150 may be connected to the pixel circuit PC, for example, the second sub-capacitor electrode CE2*b* of the storage capacitor Cst, through the sixth contact hole CT6 that penetrates through the fourth insulating layer 107 and the fifth insulating layer 109.

The first electrode 150 may include a transparent conducting oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 150 may include a reflective layer including silver (Ag), magnesium (Mg), aluminum (Al), platinum (Pt), palladium (Pd), gold (Au), nickel (Ni), neodymium (Nd), iridium (Ir), Cr, or any compounds thereof. In another embodiment, the first electrode 150 may further include a layer including ITO, IZO, ZnO or $In_2O_3$, above and/or below the reflective layer described above. For example, the first electrode 150 may have a triple-layer structure of an ITO layer, an Ag layer, and another ITO layer.

A bank layer BNL covers an edge of the first electrode 150, and may include a first bank opening B-OP1 that overlaps a central portion of the first electrode 150. The bank layer BNL may include an organic insulating layer such as polyimide.

An intermediate layer 160 may come into contact with the first electrode 150 through the first bank opening B-OP1. A stacked structure of the first electrode 150, the intermediate layer 160, and a second electrode 170 in the first bank opening B-OP1 may emit light of a color. The first bank opening B-OP1 of the bank layer BNL may correspond to an emission area EA from which light is emitted. For example, a size (or width) of the first bank opening B-OP1 of the bank layer BNL may correspond to a size (or width) of the emission area EA. In one or more embodiments, the width of the first bank opening B-OP1 in the x direction may be equal to or substantially equal to the width of the emission area EA in the x direction.

The intermediate layer 160 may include an emission layer 162. The emission layer 162 may include a polymer or low-molecular weight organic material that emits light of a color. As described above with reference to FIG. 2, when the light-emitting diode layer 300 (e.g., see FIG. 2) emits blue light, the emission layer 162 may include a polymer or low-molecular weight organic material that emits blue light.

The intermediate layer 160 may further include at least one functional layer. In one or more embodiments, as shown in FIG. 6, the intermediate layer 160 may further include a first functional layer 161 below the emission layer 162, and/or a second functional layer 163 above the emission layer 162. The first functional layer 161 may be between the first electrode 150 and the emission layer 162, and the second functional layer 163 may be between the emission layer 162 and a second electrode 170 to be described later.

The first functional layer 161 may include a hole transport layer (HTL) and/or a hole injection layer (HIL). The second functional layer 163 may include an electron transport layer (ETL) and/or an electron injection layer (EIL).

The second electrode 170 may include a conductive material having a low work function. For example, the second electrode 170 may include a (semi-) transparent layer that includes Ag, Mg, Al, Pt, Pd, Au, Ni, Nd, Ir, Cr, Li, Ca, or any alloys thereof. In one or more embodiments, the second electrode 170 may further include a layer that includes an ITO, IZO, ZnO or $In_2O_3$, above the (semi-) transparent layer including the materials described above.

The encapsulation layer 400 may be arranged on the second electrode 170. The encapsulation layer 400 may include at least one inorganic encapsulation layer and at least one organic encapsulation layer. In one or more embodiments, FIG. 6 shows that the encapsulation layer 400 includes a first inorganic encapsulation layer 410, a second inorganic encapsulation layer 430, and an organic encapsulation layer 420 between the first inorganic encapsulation layer 410 and the second inorganic encapsulation layer 430.

Each of the first and second inorganic encapsulation layers 410 and 430 may include one or more inorganic insulating materials. The inorganic insulating material may include aluminum oxide, tantalum oxide, hafnium oxide, zinc oxide, silicon oxide, silicon nitride, and/or silicon oxynitride.

The organic encapsulation layer 420 may include a polymer-based material. The polymer-based material may include acryl-based resin, epoxy-based resin, polyimide, and polyethylene. For example, the organic encapsulation layer 420 may include acryl-based resin, for example, polymethylmethacrylate, polyacrylic acid, etc. The organic encapsulation layer 420 may be provided by curing a monomer or by coating a polymer.

An intermediate material layer 501 may be arranged on the encapsulation layer 400. The intermediate material layer 501 may include an inorganic insulating material and/or an organic insulating material. A color-conversion transmissive layer 500 may be located on the intermediate material layer 501. FIG. 6 shows a first light-shielding portion (or a first light-shielding layer) 540 of the color-conversion transmissive layer (or the color-conversion transmissive unit) 500, and the first color-conversion portion 510 located in an opening area defined by the first light-shielding portion 540.

A barrier layer 550 may be provided on the color-conversion transmissive layer 500. For example, the barrier layer 550 may be provided on the first color-conversion portion 510 and/or the first light-shielding portion 540. The barrier layer 550 may include an inorganic insulating material such as silicon oxide, silicon nitride, and/or silicon oxynitride.

A color layer 600 may be arranged on the color-conversion transmissive layer 500. For example, the color layer 600 may be arranged on the color-conversion transmissive layer 500 with the barrier layer 550 therebetween. FIG. 6 shows a second light-shielding portion (or a second light-shielding layer) 640 of the color layer 600, and the first color filter 610 located in an opening defined by the second light-shielding portion 640. The first light-shielding portion 540 of the color-conversion transmissive layer 500 and the second light-shielding portion 640 of the color layer 600 are arranged to overlap each other. For example, the first light shielding portion 540 and the second light-shielding portion 640 may overlap each other in a thickness direction (e.g., a z direction as shown in FIG. 6) of the substrate 100.

The first light-shielding portion 540 and the second light-shielding portion 640 may each include a light-shielding material. For example, the first light-shielding portion 540 and the second light-shielding portion 640 may each include an organic material of a color such as black. For example, each of the first light-shielding portion 540 and the second light-shielding portion 640 may each include a polyimide (PI)-based binder, and a pigment in which red, green, and blue are mixed with each other. In one or more embodiments, each of the first light-shielding portion 540 and the second light-shielding portion 640 may include a cardo-based binder resin and a mixture of a lactam-based black pigment and a blue pigment. In one or more embodiments, each of the first light-shielding portion 540 and the second light-shielding portion 640 may include carbon black.

In one or more embodiments, the first light-shielding portion 540 and the second light-shielding portion 640 may include a same material. In another embodiment, the second light-shielding portion 640 may include a structure in which at least two color filters included in the color layer 600 overlap each other. For example, the second light-shielding portion 640 may not include the light-shielding material described above, but may have a stacked structure of two or three color filter materials selected from among the first to third color filters 610, 620, and 630 (e.g., see FIG. 2). In one or more embodiments, the stacked structure of two or three color filter materials selected from among the first to third color filters 610, 620, and 630 may overlap each other in the thickness direction (e.g., the z direction) of the substrate 100.

A light-transmitting base layer 700 may include glass or a light-transmitting organic material. For example, the light-transmitting base layer 700 may include a light-transmitting organic material such as acryl-based resin.

Figure 7:
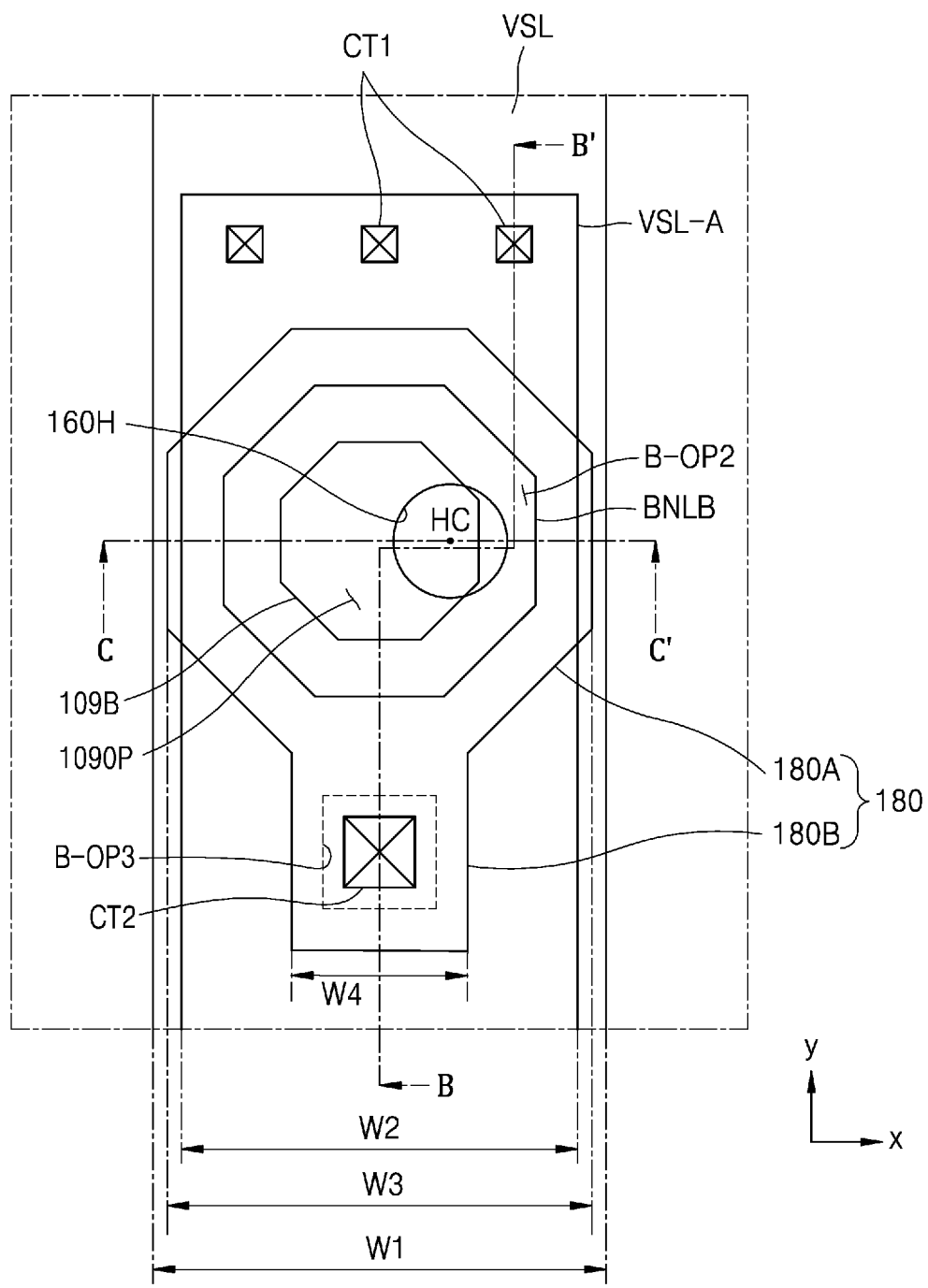
FIG. 7 is a plan view showing a structure of a common voltage line and an auxiliary electrode of a display device according to one or more embodiments.

FIG. 7 is a plan view illustrating a structure of a common voltage line and an auxiliary line of a display device according to one or more embodiments, and an enlarged plan view of a portion of the display device in FIG. 5.

Referring to FIGS. 5 and 7, the common voltage line VSL that extends in the y direction may overlap the auxiliary electrode 180 and the auxiliary common voltage line VSL-A. A length (e.g., a length in the y direction) of the auxiliary common voltage line VSL-A may be less than a length (e.g., a length in the y direction) of the common voltage line VSL. A width W2 (e.g., a width in the x direction) of the auxiliary common voltage line VSL-A may be different from a width W1 (e.g., a width in the x direction) of the common voltage line VSL. In one or more embodiments, the width W2 of the auxiliary common voltage line VSL-A may be less than the width W1 of the common voltage line VSL.

The common voltage line VSL and the auxiliary common voltage line VSL-A arranged on or at different layers from each other may be connected to each other through the first contact hole CT1 that penetrates through an insulating layer arranged between the common voltage line VSL and the auxiliary common voltage line VSL-A, and thus, a resistance of the common voltage line VSL may decrease.

The auxiliary electrode 180 may be arranged on the common voltage line VSL and the auxiliary common voltage line VSL-A. The auxiliary electrode 180 may overlap the common voltage line VSL and/or the auxiliary common voltage line VSL-A. The auxiliary electrode 180 may have a different planar shape from those of the common voltage line VSL and the auxiliary common voltage line VSL-A. For example, as shown in FIG. 7, the auxiliary electrode 180 may include a first portion (hereinafter, referred to as a wide portion 180A) having a relatively large width, and a second portion (hereinafter, a narrow portion 180B) having a relatively small width. The wide portion 180A and the narrow portion 180B are integrally coupled as a single body to each other.

A width W3 (e.g., a width in the x direction) of the wide portion 180A is greater than a width W4 (e.g., a width in the x direction) of the narrow portion 180B. The width W3 of the wide portion 180A may be greater than widths of the common voltage line VSL and/or the auxiliary common voltage line VSL-A. In one or more embodiments, FIG. 7 shows that the width W3 of the wide portion 180A is greater than the width W2 of the auxiliary common voltage line VSL-A, but less than the width W1 of the common voltage line VSL. In another embodiment, the width W3 of the wide portion 180A may be greater than the width W2 of the auxiliary common voltage line VSL-A and the width W1 of the common voltage line VSL.

A portion of the auxiliary electrode 180 may be connected to either one of the common voltage line VSL and the auxiliary common voltage line VSL-A having a same voltage level as each other. For example, the narrow portion 180B of the auxiliary electrode 180 may be connected to the auxiliary common voltage line VSL-A through the second contact hole CT2.

The other portion of the auxiliary electrode 180 may be connected to the second electrode 170 (e.g., see FIG. 6) of the light-emitting diode. For example, the second electrode 170 (e.g., see FIG. 6) of the light-emitting diode may be connected to the wide portion 180A of the auxiliary electrode 180 through a hole 160H provided in the intermediate layer 160 (e.g., see FIG. 6) arranged below the second electrode.

In a plan view, the hole 160H of the intermediate layer overlaps the wide portion 180A of the auxiliary electrode 180, and may be located in a second bank opening B-OP2 of the bank layer BNK (e.g., see FIG. 6). In a plan view, the hole 160H of the intermediate layer may be fully overlapped by the second bank opening B-OP2. In other words, the second bank opening B-OP2 may overlap the entirety of the hole 160H of the intermediate layer in a plan view. On the other hand, the hole 160H of the intermediate layer may overlap (e.g., overlap in a plan view) only a part of an opening 109OP of the fifth insulating layer 109. For example, a portion of the hole 160H of the intermediate layer may overlap the opening 109OP of the fifth insulating layer 109, and the other portion of the hole 160H may not overlap the opening 109OP of the fifth insulating layer 109. The hole 160H of the intermediate layer may be arranged regardless of a size (or width) of the opening 109OP of the fifth insulating layer 109. A detailed structure of the auxiliary electrode 180 and elements therearound will be described with reference to FIGS. 8 and 9.

Figure 8:
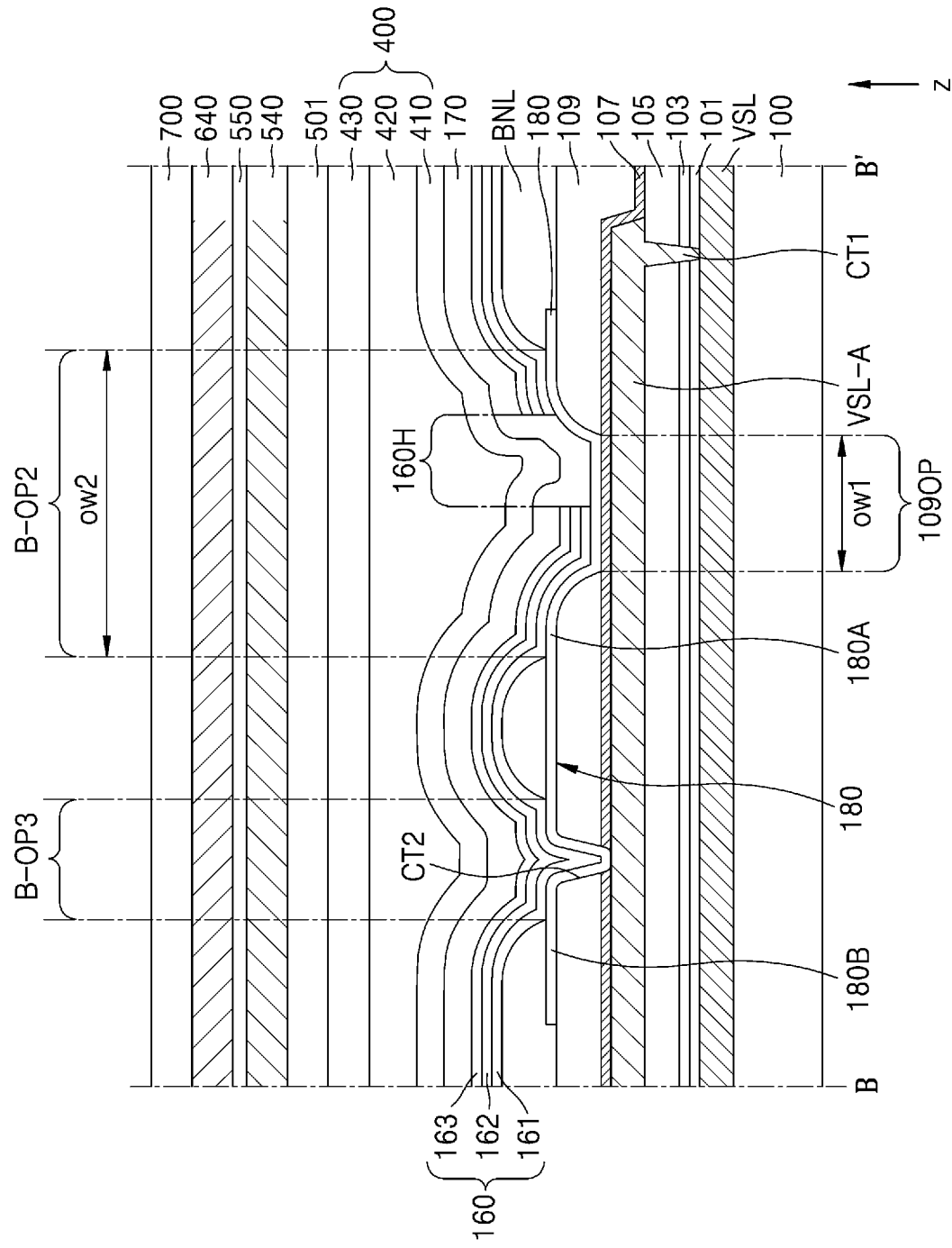
FIG. 8 is a cross-sectional view of the display device in FIG. 7 taken along the line B-B' in FIG. 7.
Figure 9:
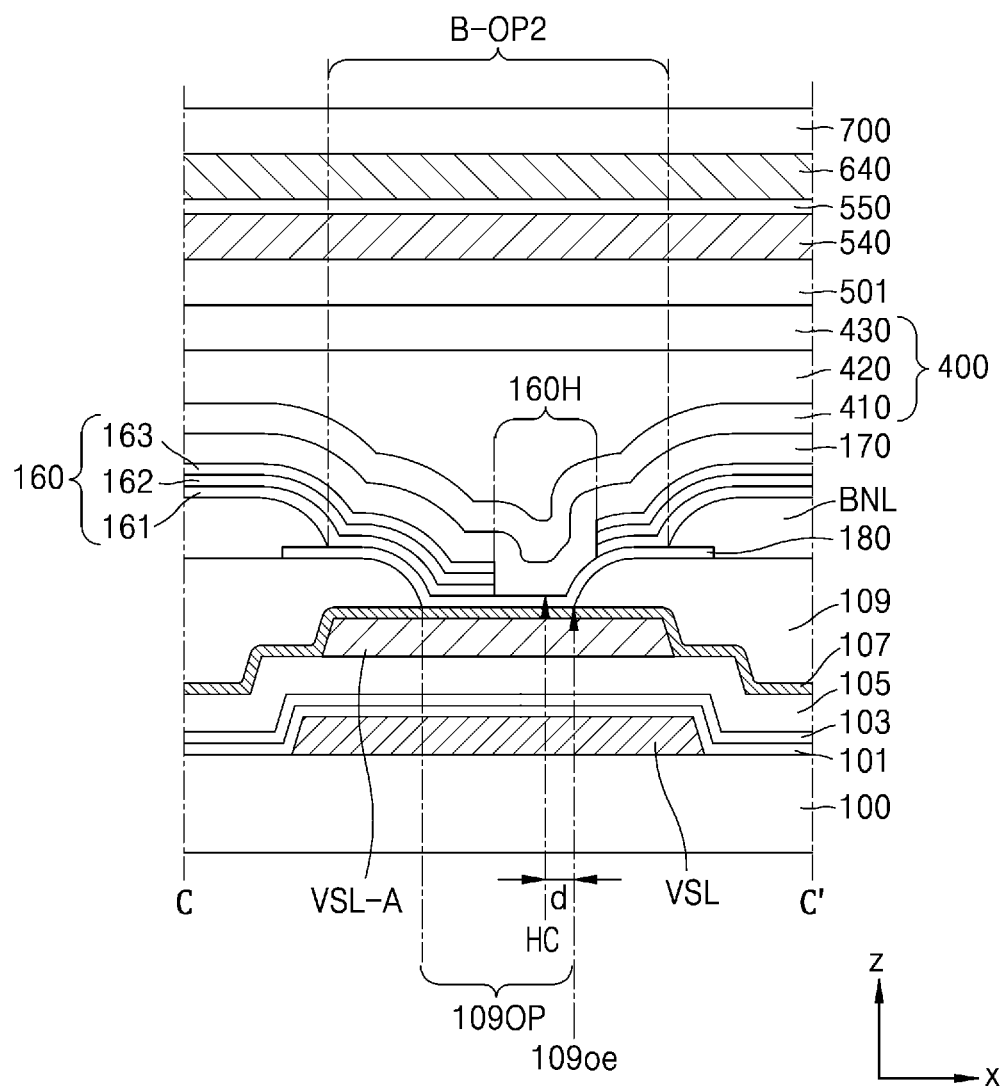
FIG. 9 is a cross-sectional view of the display device in FIG. 7 taken along the line C-C' in FIG. 7.

FIG. 8 is a cross-sectional view of the display device in FIG. 7 taken along the line B-B' in FIG. 7, and FIG. 9 is a cross-sectional view of the display device in FIG. 7 taken along the line C-C' in FIG. 7.

Referring to FIGS. 7, 8, and 9, the common voltage line VSL is arranged on the substrate 100. The common voltage line VSL may come into direct contact with an upper surface of the substrate 100. The common voltage line VSL may include a metal material such as Mo, Cu, Ti, or the like. The common voltage line VSL may include a same material as the driving voltage line VDL described above with reference to FIG. 6. The common voltage line VSL may include a stacked structure of a Ti layer (lower layer), and a Cu layer (upper layer) of which a thickness is greater than that of the Ti layer. In another embodiment, the common voltage line VSL may include a multi-layer structure of one or more metal layers including the metal materials described above, and a transparent conducting oxide layer such as an ITO layer, above the one or more metal layers.

The auxiliary common voltage line VSL-A may be arranged on the common voltage line VSL, and at least one insulating layer may be arranged between the common voltage line VSL and the auxiliary common voltage line VSL-A. FIGS. 8 and 9 show that the first to third insulating layers 101, 103, and 105 are arranged between the common voltage line VSL and the auxiliary common voltage line VSL-A.

The auxiliary common voltage line VSL-A may be connected to the common voltage line VSL through the first contact hole CT1 that penetrates through the first to third insulating layers 101, 103, and 105, as shown in FIG. 8. The auxiliary common voltage line VSL-A may include a metal material such as Mo, Cu, Ti, or the like. The auxiliary common voltage line VSL-A may include a same material as the common voltage line VSL. For example, the auxiliary common voltage line VSL-A may include a stacked structure of a Ti layer (lower layer), and a Cu layer (upper layer) of which a thickness is greater than that of the Ti layer. In another embodiment, the auxiliary common voltage line VSL-A may include a different material from that of the common voltage line VSL. For example, while the auxiliary common voltage line VSL-A may include a multi-layer structure of one or more metal layers including the metal materials described above, and a transparent conducting oxide layer such as ITO, arranged above the one or more metal layers, the common voltage line VSL may not include a transparent conducting oxide, but may include layer(s) including a metal.

The auxiliary common voltage line VSL-A may be protected by the fourth insulating layer 107. For example, the fourth insulating layer 107 may cover the auxiliary common voltage line VSL-A while being in contact with an upper surface of the auxiliary common voltage line VSL-A. For example, the fourth insulating layer 107 may cover a portion of the auxiliary common voltage line VSL-A located immediately below the opening 109OP of the fifth insulating layer 109. The fourth insulating layer 107 may include an inorganic material, as described above.

The fifth insulating layer 109 is arranged on the fourth insulating layer 107. The opening 109OP of the fifth insulating layer 109 may provide an outgassing passage. For example, gas included in the fifth insulating layer 109 including an organic insulating material during a manufacturing process of a display device may be emitted through the opening 109OP in the fifth insulating layer 109.

The opening 109OP of the fifth insulating layer 109 may overlap the auxiliary common voltage line VSL-A. To prevent or protect the auxiliary common voltage line VSL-A from being damaged in the process of forming the opening 109OP and/or a process subsequent to the formation of the opening 109OP, a portion of the auxiliary common voltage line VSL-A located immediately below the opening 109OP may be covered (e.g., entirely covered) with the fourth insulating layer 107. In one or more embodiments, the auxiliary common voltage line VSL-A may include Cu, which has a relatively low resistance. For example, the auxiliary common voltage line VSL-A may include a stacked structure of a Ti layer (lower layer) and a Cu layer (upper layer). However, the Cu layer, which may be damaged relatively easily, is covered with the fourth insulating layer 107, and thus, may be prevented or protected from being damaged.

The auxiliary electrode 180 may be arranged on the fifth insulating layer 109. The auxiliary electrode 180 may be connected to the auxiliary common voltage line VSL-A through the second contact hole CT2 that penetrates through the fifth insulating layer 109 and the fourth insulating layer 107. The auxiliary common voltage line VSL-A is connected to the common voltage line VSL through the first contact hole CT1, and thus, may be connected (e.g., electrically connected) to the common voltage line VSL via the auxiliary common voltage line VSL-A.

The auxiliary electrode 180 may include a same material as the first electrode 150 (e.g., see FIG. 6) of the light-emitting diode. For example, the auxiliary electrode 180 may include a stacked structure of an ITO layer, an Ag layer, and another ITO layer. A portion of the auxiliary electrode 180, for example, the wide portion 180A, may overlap the opening 109OP in the fifth insulating layer 109. The wide portion 180A of the auxiliary electrode 180 may come into direct contact with an upper surface of the fourth insulating layer 107 through the opening 109OP. For example, in an area that corresponds to the opening 109OP of the fifth insulating layer 109, the upper surface of the fourth insulating layer 107 may come into direct contact with the auxiliary electrode 180, and a lower surface of the fourth insulating layer 107 may come into direct contact with the auxiliary common voltage line VSL-A.

The bank layer BNL may be arranged on the auxiliary electrode 180. The bank layer BNL may include the second bank opening B-OP2 that overlaps the wide portion 180A of the auxiliary electrode 180, and a third bank opening B-OP3 that overlaps the narrow portion 180B of the auxiliary electrode 180.

The second bank opening B-OP2 fully overlaps the opening 109OP in the fifth insulating layer 109, and a size (or width) ow2 of the second bank opening B-OP2 is greater than a size (or width) ow1 of the opening 109OP in the fifth insulating layer 109. In other words, the second bank opening B-OP2 overlaps the entirety of the opening 109OP in the fifth insulating layer 109. Thus, the opening 109OP in the fifth insulating layer 109 is within the second bank opening B-OP2 in the plan view in FIG. 7. FIG. 7 shows that, in a plan view, a contour line 109B of the opening 109OP in the fifth insulating layer 109 is within a contour line BNLB of the second bank opening B-OP2. In one or more embodiments, the contour line BNLB of the second bank opening B-OP2 surrounds the contour line 109B of the opening 109OP in a plan view.

The intermediate layer 160 that may include the first functional layer 161, the emission layer 162, and the second functional layer 163 may be arranged on the bank layer BNL. A portion of the intermediate layer 160 is within the second bank opening B-OP2, and includes the hole 160H that overlaps a portion of the opening 109OP in the fifth insulating layer 109. The hole 160H of the intermediate layer 160 may penetrate through the first functional layer 161, the emission layer 162, and the second functional layer 163. The second electrode 170 of the light-emitting diode may be connected to the auxiliary electrode 180 through the hole 160H in the intermediate layer 160.

As shown in FIGS. 8 and 9, a portion of the hole 160H in the intermediate layer 160 may overlap the opening 109OP in the fifth insulating layer 109, and the other portion of the hole 160H may overlap a material portion of the fifth insulating layer 109. Because the hole 160H in the intermediate layer 160 partially overlaps the opening 109OP in the fifth insulating layer 109, the hole 160H having a desired or suitable size (or width) may be provided at a desired or suitable position regardless of a size (or width) of the opening 109OP.

A center HC of the hole 160H in the intermediate layer 160 may be within the opening 109OP in the fifth insulating layer 109, as shown in FIG. 9. In other words, the center HC of the hole 160H in the intermediate layer 160 may be within an inner edge 109oe of the fifth insulating layer 109 that corresponds to the contour line 109B (e.g., see FIG. 7) of the fifth insulating layer 109 and may define the opening 109OP. In other words, the center HC of the hole 160H in the intermediate layer 160 is not located in the material portion of the fifth insulating layer 109, the material portion of the fifth insulating layer 109 being an outer material portion that surrounds (e.g., entirely surrounds) the inner edge 109oe.

The hole 160H in the intermediate layer 160 may be provided by irradiating a laser beam. In a comparative example, when the center HC of the hole 160H in the intermediate layer 160 deviates from the opening 109OP and overlaps the material portion of the fifth insulating layer 109, a phenomenon in which the fifth insulating layer 109 and/or the auxiliary electrode 180 arranged thereon are lifted may occur due to emission of gas remaining in the fifth insulating layer 109, and thus, a connection failure between the auxiliary electrode 180 and the second electrode 170 of the light-emitting diode may be caused. The center HC of the hole 160H may be, as shown in FIGS. 7 and 9, spaced (or spaced apart) by a first distance d from the inner edge 109oe of the fifth insulating layer 109 that corresponds to the contour line 109B of the opening 109OP. The first distance d may be about 1 µm or greater.

The encapsulation layer 400 that includes the first inorganic encapsulation layer 410, the organic encapsulation layer 420, and the second inorganic encapsulation layer 430 covers a contact area (or connection area) between the auxiliary electrode 180 and the second electrode 170 of the light-emitting diode. The contact area between the auxiliary electrode 180 and the second electrode 170 of the light-emitting diode may be overlapped by the first light-shielding portion 540 of the color-conversion transmissive layer 500, the barrier layer 550, the second light-shielding portion 640 of the color layer 600, the light-transmitting base layer 700, and the intermediate material layer 501 above the encapsulation layer 400.

FIGS. 10 to 14 are cross-sectional views of a display device according to a manufacturing process of the display device, according to one or more embodiments. For convenience of description, FIGS. 10 to 14 are cross-sections taken along the line A-A' in FIG. 5, and cross-sections taken along the line C-C' in FIG. 7, according to a manufacturing process of the display device.

Figure 10:
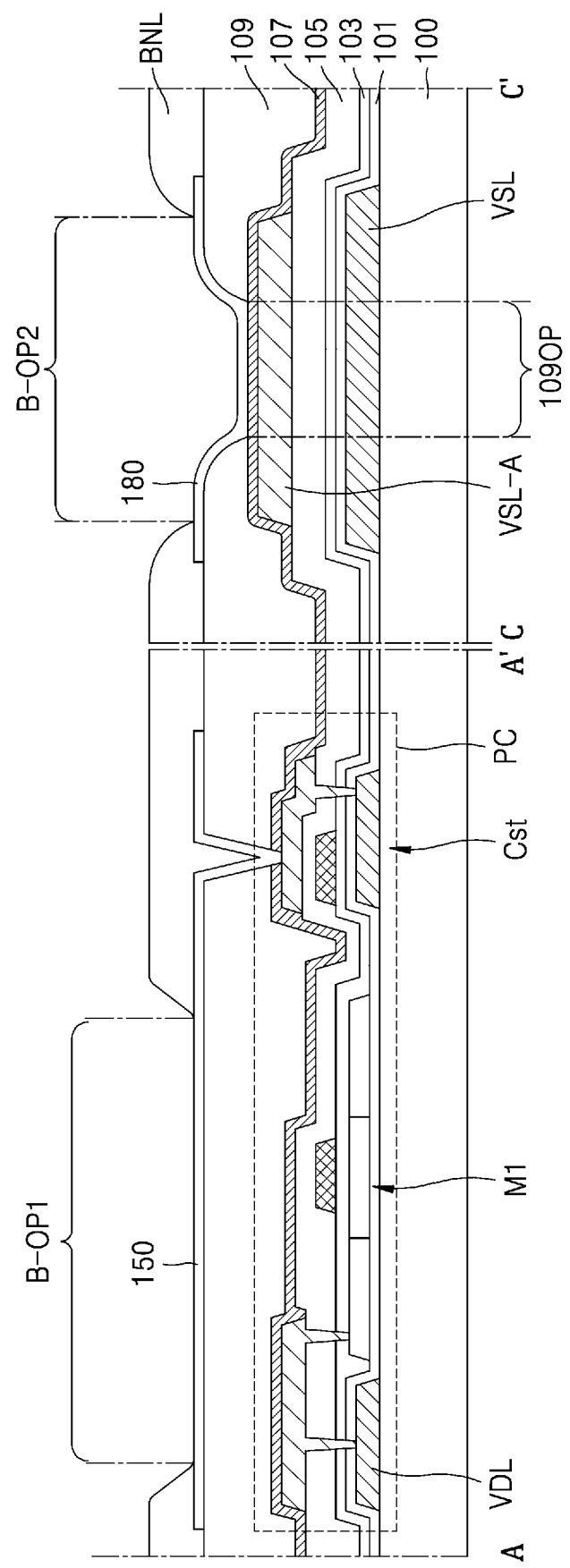
FIGS. 10 to 14 are cross-sectional views of a display device according to a manufacturing process of the display device, according to one or more embodiments.

Referring to FIG. 10, the first electrode 150 and the auxiliary electrode 180 of the light-emitting diode are provided on an insulating layer, for example, the fifth insulating layer 109. The first electrode 150 and the auxiliary electrode 180 may be provided together in a same process, and may include a same material as each other.

Before the first electrode 150 and the auxiliary electrode 180 are provided above the substrate 100, the pixel circuit PC that includes the driving transistor M1 and the storage capacitor Cst may be provided on the substrate 100. In addition, the first to fifth insulating layers 101, 103, 105, 107, and 109 may be provided above the substrate 100, and detailed materials and positions thereof are as described above with reference to FIGS. 6, 8, and 9.

The driving voltage line VDL, the common voltage line VSL, and the auxiliary common voltage line VSL-A may be provided together with electrodes of the driving transistor M1 and/or the storage capacitor Cst. In one or more embodiments, before the formation process of the auxiliary common voltage line VSL-A, the first contact hole CT1 (e.g., see FIG. 8) that penetrates through the first to third insulating layers 101, 103, and 105 may be provided, and the common voltage line VSL may be connected to the auxiliary common voltage line VSL-A through the first contact hole CT1 (e.g., see FIG. 8). After the auxiliary common voltage line VSL-A is formed, the fourth insulating layer 107 that includes an inorganic insulating material may be provided.

The fifth insulating layer 109 may be provided on the fourth insulating layer 107. A process of forming the fifth insulating layer 109 may include a process of forming the sixth contact hole CT6 for connection between the pixel circuit PC and the first electrode 150, and a process of forming the opening 109OP in the fifth insulating layer 109. The opening 109OP may be provided by etching a portion of the fifth insulating layer 109 that overlaps the auxiliary common voltage line VSL-A, and thus, the opening 109OP may overlap the auxiliary common voltage line VSL-A. The second contact hole CT2 (e.g., see FIG. 8) described above with reference to FIG. 8 may be provided together with the opening 109OP in the fifth insulating layer 109.

The bank layer BNL is provided on the first electrode 150 and the auxiliary electrode 180, and may include the first bank opening B-OP1 that overlaps the first electrode 150, and the second bank opening B-OP2 that overlaps the auxiliary electrode 180. A size (or width) of the second bank opening B-OP2 may be less than a size (or width) of the first bank opening B-OP1.

Figure 11:
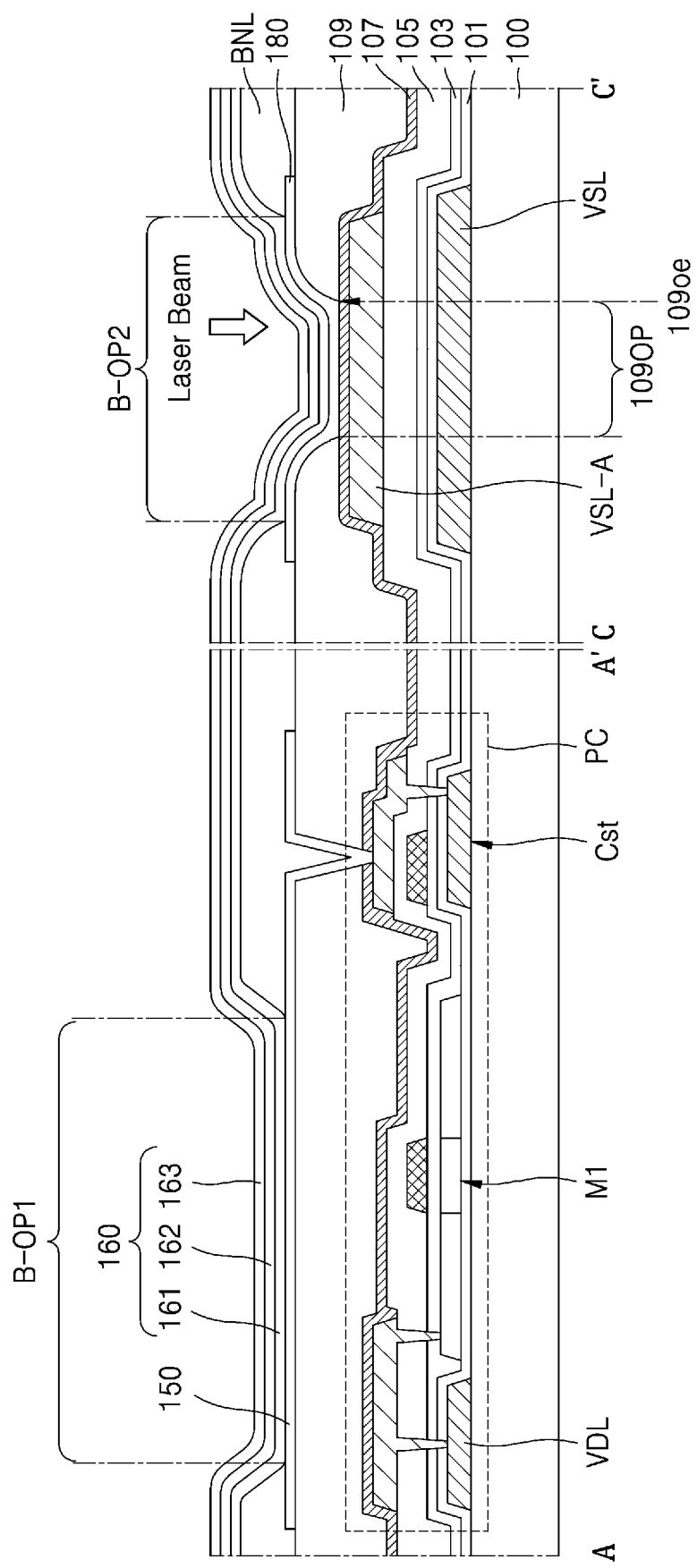

Referring to FIG. 11, the intermediate layer 160 is provided on the bank layer BNL. The intermediate layer 160 may overlap the first electrode 150 exposed through the first bank opening B-OP1, and the auxiliary electrode 180 exposed through the second bank opening B-OP2.

The intermediate layer 160 includes the emission layer 162, and thus, a process of forming the intermediate layer 160 may include a process of forming the emission layer 162. The process of forming the intermediate layer 160 may further include a process of forming the first functional layer 161 below the emission layer 162 and/or the second functional layer 163 above the emission layer 162. In FIGS. 11 and 12-14 to be described later, it is described that the intermediate layer 160 includes the first functional layer 161, the emission layer 162, and the second functional layer 163.

Figure 12:
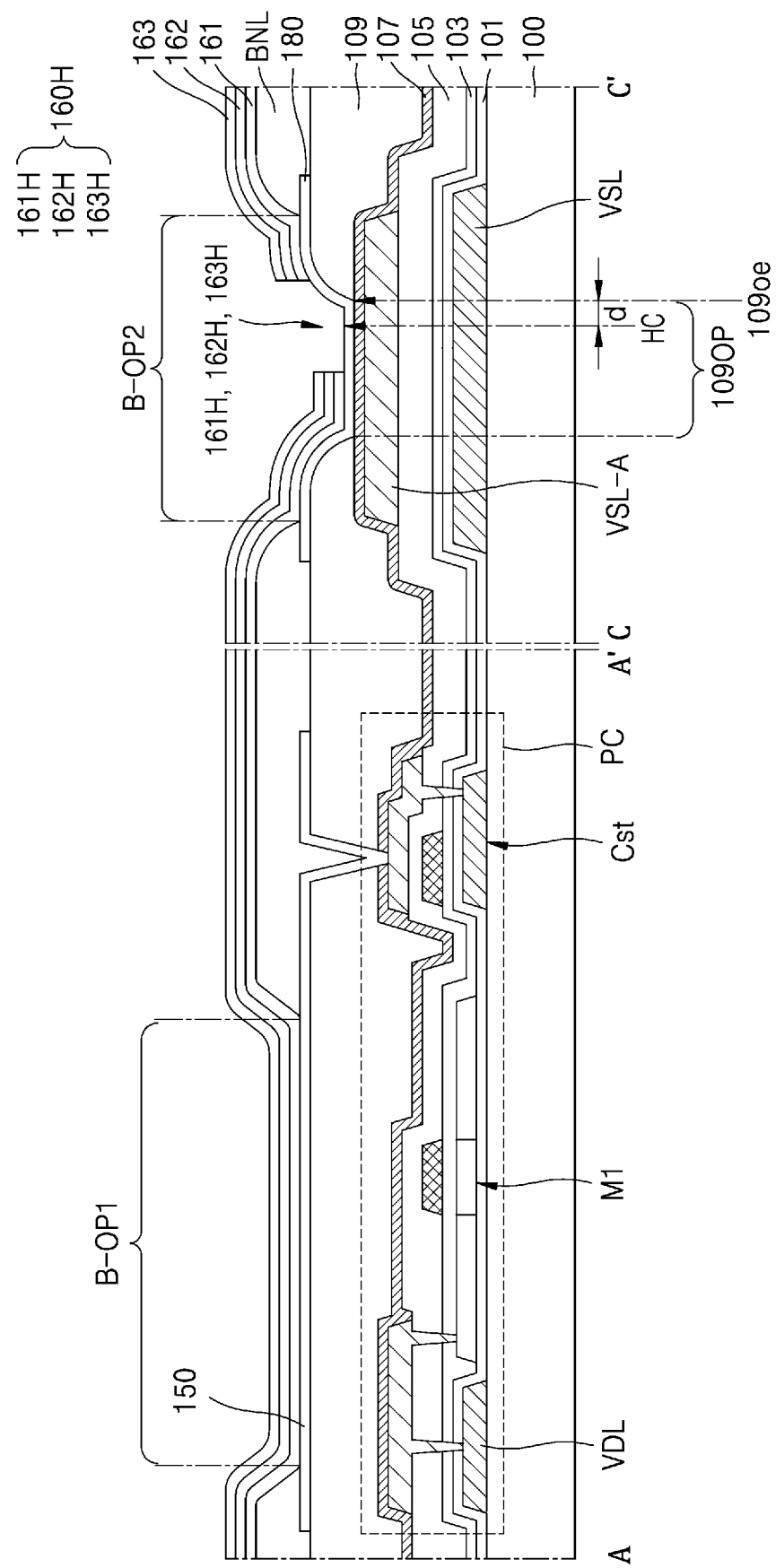

Then, as shown in FIG. 12, the hole 160H is formed by irradiating a laser beam on the intermediate layer 160. In one or more embodiments, the laser beam may include an ultraviolet (UV) laser beam having a wavelength of about 300 nm to 400 nm, and an output per unit area of the laser beam may be about 200 mJ/cm$^2$ or less.

When the laser beam is irradiated, the laser beam may be within the second bank opening B-OP2, and a center of the laser beam may be within the opening 109OP in the fifth insulating layer 109. In other words, the center of the laser beam may be on the inside of the inner edge 109oe of the fifth insulating layer 109 that corresponds to the contour line of the opening 109OP in the fifth insulating layer 109. When the center of the laser beam deviates from the inner edge 109oe and overlaps the material portion of the fifth insulating layer 109, a phenomenon in which the fifth insulating layer 109 and/or the auxiliary electrode 180 are lifted due to outgassing may occur, and thus, it may be appropriate or suitable to irradiate the laser beam such that the center of the laser beam is within the opening 109OP in the fifth insulating layer 109.

A hole 161H in the first functional layer 161, a hole 162H in the emission layer 162, and a hole 163H in the second functional layer 163 may be provided by the laser beam. A center of the hole 162H in the emission layer 162 may match with a center of a hole in a functional layer, for example, a center of the hole 161H in the first functional layer 161 and/or a center of the hole 163H in the second functional layer 163.

The hole 160H in the intermediate layer 160 may be provided by overlapping the hole 161H in the first functional layer 161, the hole 162H in the emission layer 162, and the hole 163H in the second functional layer 163, and the center of the hole 161H in the first functional layer 161, the center of the hole 162H in the emission layer 162, and the center of the hole 163H in the second functional layer 163 may correspond to the center HC of the hole 160H described above with reference to FIG. 9. The center HC in the hole 160H may be spaced (or spaced apart) by the first distance d from the inner edge 109oe of the fifth insulating layer 109. For example, the first distance d may be about 1 μm or greater.

Figure 13:
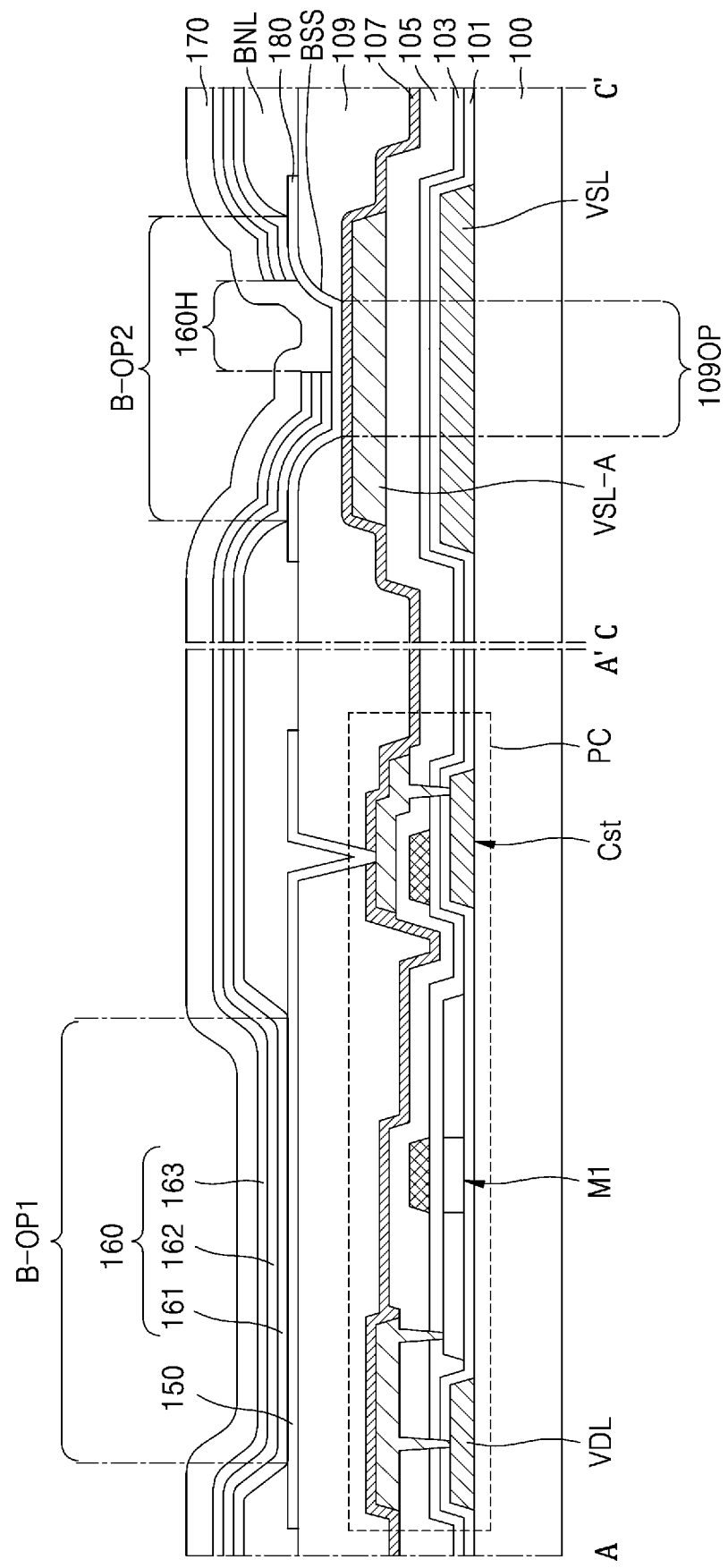

Thereafter, the second electrode 170 of the light-emitting diode may be provided as shown in FIG. 13. The second electrode 170 may come into direct contact with and be connected (e.g., be electrically connected) to the auxiliary electrode 180 through the hole 160H. A contact area between the second electrode 170 and the auxiliary electrode 180 is within the second bank opening B-OP2, and a portion of the contact area may be on an inclined surface BSS of the fifth insulating layer 109.

Figure 14:
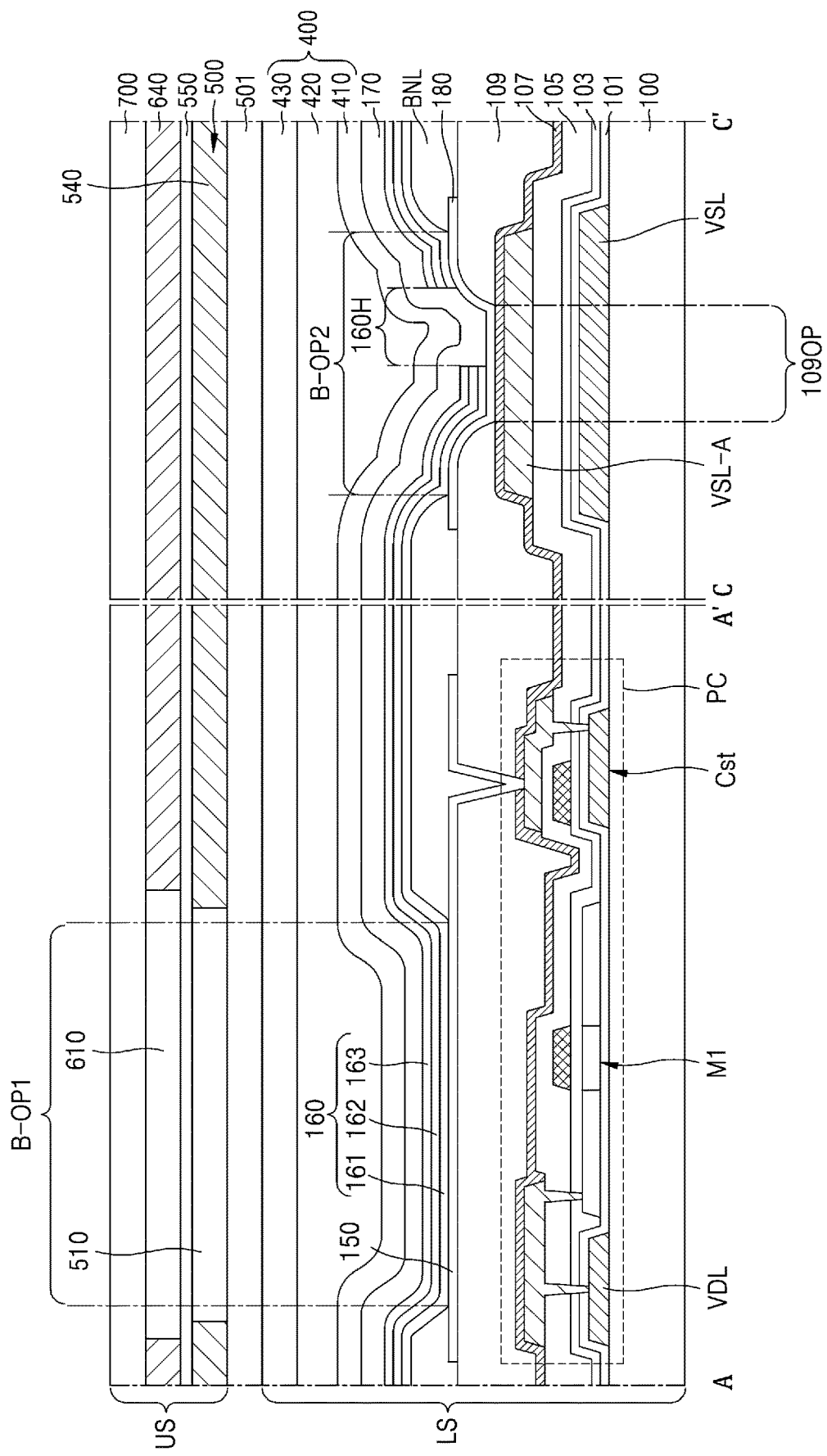

Referring to FIG. 14, the encapsulation layer 400 is provided on the second electrode 170. The encapsulation layer 400 may include the first and second inorganic encapsulation layers 410 and 430 provided by chemical vapor deposition, and the organic encapsulation layer 420 that may be provided by applying a monomer and then curing it. The color-conversion transmissive layer 500, the color layer 600, and the light-transmitting base layer 700 may be provided above the encapsulation layer 400.

In one or more embodiments, after a lower structure LS from the substrate 100 to the encapsulation layer 400, and an upper structure US that includes the color-conversion transmissive layer 500, the color layer 600, and the light-transmitting base layer 700 are formed, the lower structure LS and the upper structure US may be bonded to each other and arranged so that the encapsulation layer 400 and the color-conversion transmissive layer 500 face each other with the intermediate material layer 501 therebetween.

In another embodiment, instead of additionally providing the lower structure LS and the upper structure US, the intermediate material layer 501 may be formed above the encapsulation layer 400, and the color-conversion transmissive layer 500, the color layer 600, and the light-transmitting base layer 700 may be sequentially provided above the intermediate material layer 501.

According to the embodiments of the present disclosure, when a hole is provided in an intermediate layer, process restrictions due to a size of an opening in an insulating layer may be reduced, and the quality of a contact area between an auxiliary electrode and a second electrode above the auxiliary electrode may be ensured. However, these objectives are examples and do not limit the scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising:
    a substrate;
    an organic insulating layer on the substrate and having an opening;
    a first electrode on the organic insulating layer;
    an auxiliary electrode on the organic insulating layer and comprising a first portion overlapping the opening in the organic insulating layer;
    a bank layer having a first bank opening overlapping the first electrode and a second bank opening overlapping the first portion;
    an intermediate layer on the first electrode and the auxiliary electrode, the intermediate layer having a hole exposing a portion of the auxiliary electrode; and
    a second electrode on the intermediate layer, overlapping the first electrode and the auxiliary electrode, and in contact with the auxiliary electrode through the hole in the intermediate layer,
    wherein the hole in the intermediate layer only partially overlaps the opening in the organic insulating layer and is located within the second bank opening in a plan view.

2. The display device of claim 1, wherein, in a plan view, a portion of the hole in the intermediate layer is located in the opening in the organic insulating layer, and a remaining portion of the hole in the intermediate layer is located between a contour line of the opening in the organic insulating layer and a contour line of the second bank opening.

3. The display device of claim 1, wherein the organic insulating layer comprises an inclined surface adjacent to the opening, and
    a portion of a contact area between the second electrode and the auxiliary electrode is located on the inclined surface of the organic insulating layer.

4. The display device of claim 1, wherein a center of the hole in the intermediate layer is located within the opening in the organic insulating layer in a plan view.

5. The display device of claim 4, wherein the center of the hole in the intermediate layer is spaced by about 1 μm or greater from an inner edge of the organic insulating layer that defines the opening in the organic insulating layer.

6. The display device of claim 1, further comprising:
    a common voltage line on the substrate and extending in a direction; and
    an auxiliary common voltage line overlapping the common voltage line and electrically connected to the common voltage line through a contact hole defined in at least one insulating layer arranged between the auxiliary common voltage line and the common voltage line,
    wherein the auxiliary common voltage line and the common voltage line overlap the opening in the organic insulating layer.

7. The display device of claim 6, further comprising an inorganic insulating layer in direct contact with an upper surface of the auxiliary common voltage line.

8. The display device of claim 7, wherein the first portion of the auxiliary electrode overlapping the opening in the organic insulating layer has a width greater than a width of the opening in the organic insulating layer,
- wherein the auxiliary electrode comprises a second portion that is integrally provided as a single body with the first portion and has a width less than a width of the first portion, and
- wherein the second portion of the auxiliary electrode is electrically connected to the auxiliary common voltage line through a contact hole that penetrates through the organic insulating layer and the inorganic insulating layer.

9. The display device of claim 1, wherein the intermediate layer comprises an emission layer, and
- wherein the hole in the intermediate layer comprises a hole penetrating through the emission layer.

10. A method of manufacturing a display device, the method comprising:
- providing, on a substrate, an organic insulating layer having an opening;
- providing a first electrode on the organic insulating layer;
- providing, on the organic insulating layer, an auxiliary electrode comprising a first portion overlapping the opening of the organic insulating layer;
- providing a bank layer having a first bank opening overlapping the first electrode and a second bank opening overlapping the first portion of the auxiliary electrode;
- providing an intermediate layer on the first electrode and the auxiliary electrode;
- providing, in the intermediate layer, a hole that exposes a portion of the auxiliary electrode; and
- providing a second electrode on the intermediate layer so that the second electrode is in contact with the auxiliary electrode through the hole in the intermediate layer,
- wherein the hole in the intermediate layer only partially overlaps the opening in the organic insulating layer and is located within the second bank opening in a plan view.

11. The method of claim 10, wherein the providing the hole comprises irradiating a laser beam on the intermediate layer, and
- wherein a portion of the laser beam is located between a contour line of the opening in the organic insulating layer and a contour line of the second bank opening in a plan view.

12. The method of claim 11, wherein a center of the laser beam is located within the second bank opening.

13. The method of claim 10, wherein a center of the hole in the intermediate layer is spaced by about 1 μm or greater from an inner edge of the organic insulating layer that defines the opening in the organic insulating layer.

14. The method of claim 10, wherein the organic insulating layer comprises an inclined surface adjacent to the opening, and
- wherein, in the providing the second electrode, a portion of a contact area between the second electrode and the auxiliary electrode is located on the inclined surface of the organic insulating layer.

15. The method of claim 10, wherein the first portion of the auxiliary electrode overlapping the opening in the organic insulating layer has a width greater than a width of the opening in the organic insulating layer,
- wherein the auxiliary electrode comprises a second portion that is integrally provided as a single body with the first portion and has a width less than a width of the first portion.

16. The method of claim 15, further comprising:
- providing a common voltage line that is arranged on the substrate and extends in a direction; and
- providing an auxiliary common voltage line that overlaps the common voltage line and is electrically connected to the common voltage line through a contact hole defined in at least one insulating layer arranged between the auxiliary common voltage line and the common voltage line,
- wherein the auxiliary common voltage line and the common voltage line overlap the opening in the organic insulating layer.

17. The method of claim 16, further comprising providing an inorganic insulating layer on the auxiliary common voltage line.

18. The method of claim 17, further comprising providing a contact hole that penetrates through the organic insulating layer and the inorganic insulating layer to electrically connect the second portion of the auxiliary electrode to the auxiliary common voltage line.

19. The method of claim 10, wherein, in a plan view, a portion of a contour line of the opening in the organic insulating layer overlaps the hole in the intermediate layer.

20. The method of claim 10, wherein the providing the intermediate layer comprises providing an emission layer that overlaps the first electrode and the auxiliary electrode, and
- wherein the providing the hole comprises providing a hole that penetrates through the emission layer.

* * * * *